United States Patent
Okita

(10) Patent No.: US 7,838,858 B2
(45) Date of Patent: Nov. 23, 2010

(54) EVALUATION SYSTEM AND METHOD OF A SEARCH OPERATION THAT DETECTS A DETECTION SUBJECT ON AN OBJECT

(75) Inventor: Shinichi Okita, Tokyo (JP)

(73) Assignee: Nikon Corporation, Tokyo (JP)

( * ) Notice: Subject to any disclaimer, the term of this patent is extended or adjusted under 35 U.S.C. 154(b) by 109 days.

(21) Appl. No.: 11/442,270

(22) Filed: May 30, 2006

(65) Prior Publication Data

US 2006/0285740 A1 Dec. 21, 2006

Related U.S. Application Data

(60) Provisional application No. 60/722,473, filed on Oct. 3, 2005.

(30) Foreign Application Priority Data

May 31, 2005 (JP) ............................. 2005-158322

(51) Int. Cl.
*G01N 21/86* (2006.01)
*G06M 7/00* (2006.01)

(52) U.S. Cl. ............................ 250/559.44; 250/559.3; 250/221

(58) Field of Classification Search ................ 250/548, 250/221, 559.01, 559.04, 559.4, 559.44, 250/559.29, 559.3; 355/53; 356/401, 399; 382/151, 184, 287
See application file for complete search history.

(56) References Cited

U.S. PATENT DOCUMENTS

| | | | |
|---|---|---|---|
| 4,780,617 A | 10/1988 | Umatate et al. | |
| 5,448,332 A | 9/1995 | Sakakibara et al. | |
| 5,525,808 A * | 6/1996 | Irie et al. | 250/548 |
| 5,646,413 A | 7/1997 | Nishi | |
| 5,798,195 A * | 8/1998 | Nishi | 430/22 |
| 6,778,257 B2 | 8/2004 | Bleeker et al. | |
| 6,992,766 B2 * | 1/2006 | Tanaka et al. | 356/401 |
| 2003/0025890 A1 | 2/2003 | Nishinaga | |
| 2004/0027630 A1* | 2/2004 | Lizotte | 359/15 |
| 2005/0036144 A1 | 2/2005 | Suzuki | |

FOREIGN PATENT DOCUMENTS

| | | |
|---|---|---|
| JP | A-6-283403 | 10/1994 |
| JP | A-7-321028 | 12/1995 |
| JP | A-10-214783 | 8/1998 |
| JP | A-2001-313250 | 11/2001 |
| JP | A-2004-014758 | 1/2004 |
| JP | A-2004-103992 | 4/2004 |
| JP | A-2004-119455 | 4/2004 |
| JP | A-2005-030963 | 2/2005 |
| JP | A-2006-114583 | 4/2006 |
| WO | WO 98/40791 | 9/1998 |
| WO | WO99/49504 | 9/1999 |
| WO | WO 2006/019166 A1 | 2/2006 |

* cited by examiner

*Primary Examiner*—Georgia Y Epps
*Assistant Examiner*—Pascal M Bui-Pho
(74) *Attorney, Agent, or Firm*—Oliff & Berridge, PLC

(57) ABSTRACT

First, an operator inputs various parameters required for a mark recognition operation including a designated position coordinate designated via a mouse and a keyboard (step 201). Then, an edge potential position closest to the designated position is selected (step 205), or an edge potential position within a predetermined range having the designated position as a datum is selected (step 207), and a mark recognition operation is performed at the selected edge potential position (step 209). The recognition results are shown on a display (step 211).

34 Claims, 16 Drawing Sheets

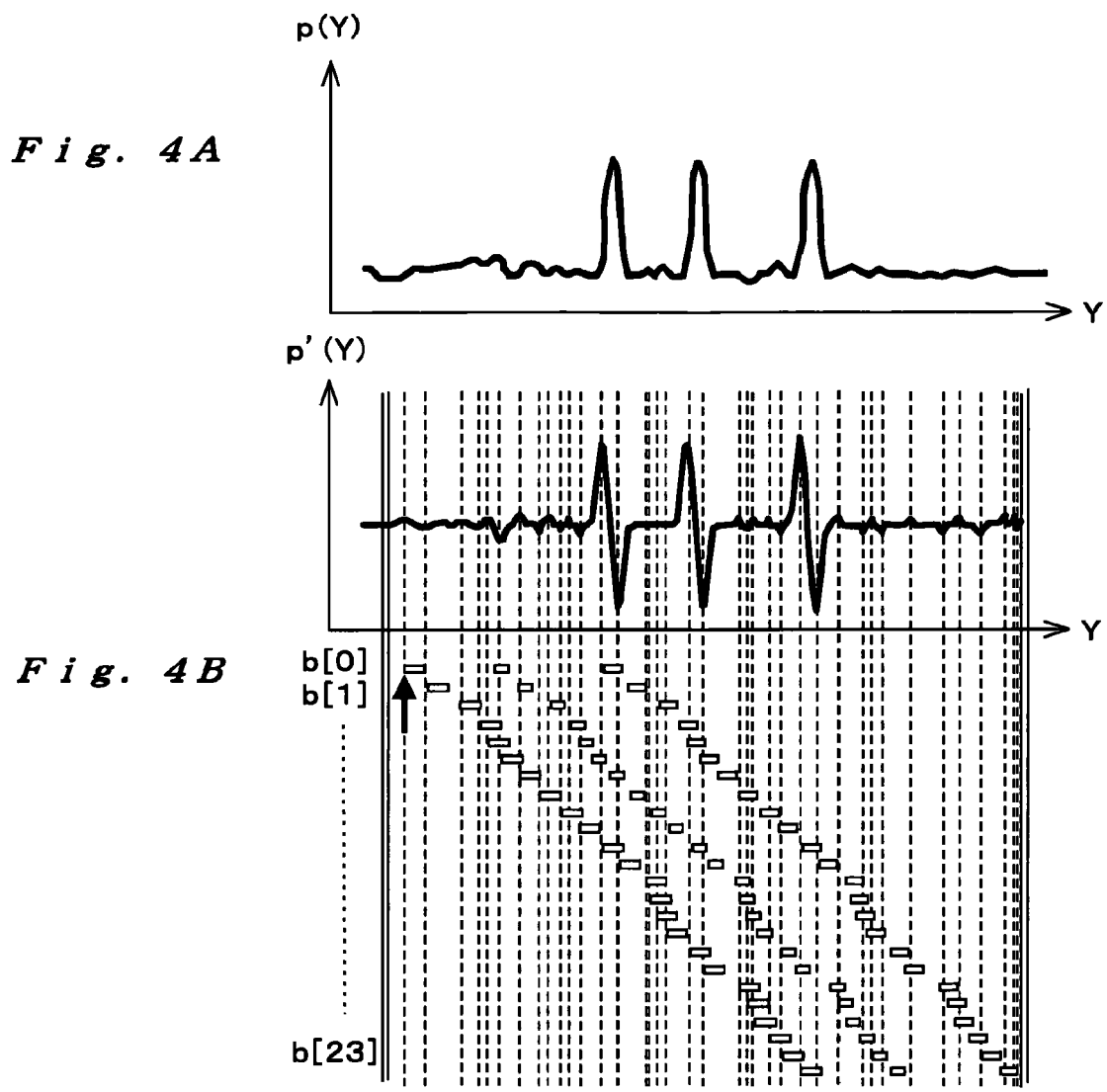

Fig. 5

| ERROR CODE | ERROR FACTOR TYPE |
|---|---|
| errorcode01 | TOTAL NUMBER OF EDGES WITHIN A MARK TEMPLATE FRAME IS SMALLER THAN SET EDGE NUMBER |
| errorcode02 | AN EDGE WITHIN A MARK TEMPLATE FRAME PROTRUDES OUTSIDE AN OPERATION RANGE |
| errorcode03 | EDGE INTENSITY WITHIN A MARK DETECTION AREA IS TOO SMALL |
| errorcode04 | DIRECTION OF AN EDGE IS NOT OPPOSITE TO DIRECTION OF A NEXT EDGE WITHIN A MARK DETECTION AREA |
| errorcode05 | MARK DISTANCE ERROR EXCEEDS A LIMIT |
| errorcode06 | MARK WIDTH ERROR EXCEEDS A LIMIT |
| errorcode07 | BALANCE OF MARK EDGE DISTANCE EXCEEDS A LIMIT |
| errorcode08 | BALANCE OF MARK EDGE INTENSITY EXCEEDS A LIMIT |
| errorcode09 | DEVIATION OF EDGE INTENSITY BETWEEN LINE MARKS EXCEEDS A LIMIT |
| errorcode0A | NUMBER OF DETECTED EDGES OF A LINE MARK IS SMALLER THAN SET EDGE NUMBER |

EVALUATION SYSTEM AND METHOD OF A SEARCH OPERATION THAT DETECTS A DETECTION SUBJECT ON AN OBJECT

CROSS-REFERENCE TO RELATED APPLICATIONS

This non-provisional application claims the benefit of Provisional Application No. 60/722,473 filed Oct. 3, 2005, the disclosure of which is hereby incorporated herein by reference in its entirety.

BACKGROUND OF THE INVENTION

1. Field of the Invention

The present invention relates to evaluation systems and evaluation methods, and more particularly to an evaluation system and an evaluation method that obtains a photoelectric conversion signal by photoelectrically detecting an area subject to detection, which includes a detection subject on an object, and evaluates a search operation of the detection subject that uses the photoelectric conversion signal.

2. Description of the Related Art

Recently, in a process of manufacturing devices such as semiconductor devices, exposure apparatuses by a step-and-repeat method or a step-and-scan method, wafer probers, laser repair apparatuses or the like are used. In these apparatuses, each of a plurality of shot areas arranged on a substrate need to be positioned (aligned) extremely precisely with a predetermined datum point (e.g. a processing operation point of each apparatus) in a stationary coordinate system that sets a moving position of the substrate (an orthogonal coordinate system that sets a position coordinate of a stage holding the substrate, that is, a stage coordinate system).

In an exposure apparatus, in particular, 10 or more layers of circuit patterns (reticle patterns) are overlaid and transferred onto a substrate (hereinafter referred to as 'wafer'), and in the case the overlay accuracy between layers is poor, inconveniences may arise in the quality of the circuit. In such a case, the chip does not satisfy a desired quality, and the chip becomes defective in the worst case, which reduces the yield. Accordingly, in the exposure apparatus, an alignment mark is arranged in advance in each of a plurality of shot areas (areas where circuit patterns are transferred) on a wafer, and a position coordinate of the alignment mark in a stage coordinate system that sets movement of a stage holding the wafer is detected. After that, wafer alignment is performed in which an individual shot area on the wafer is aligned with a reticle pattern based on a positional relation (measured beforehand) between the position coordinate of the mark and the known reticle pattern.

In the wafer alignment, a waveform data that represents photoelectric conversion signals corresponding to areas on the wafer including the alignment marks is obtained, and in the obtained waveform data, a section corresponding to the alignment marks are searched for and the positions where it is recognized that the alignment marks exist are detected as the position coordinates of the alignment marks in the stage coordinate system.

More specifically, by searching the waveform data, several positions (potential positions) are extracted that are highly likely to be positions of the alignment marks from the waveform data based on characteristics of the alignment marks, and the correlativity between a template waveform when matching the template waveform of the mark with each of a plurality of potential positions and the waveform data corresponding to the template waveform is obtained. Based on the correlativity, the judgment is made of whether the marks could be recognized or not, and out of the positions where it is judged that the marks were recognized, the position where the correlativity is highest is detected as the position of the mark.

Meanwhile, in the case the waveform data is searched and the above correlativity is equal to or less than a predetermined level at all the potential positions, a so-called mark detection error is generated since the marks could not be recognized. As the causes for not being able to recognize the marks at any potential position, various causes can be considered. For example, it is a matter of course that the marks cannot be recognized at times due to a noise component included in the waveform data, however, the case can also be considered where values of processing parameters that set a mark recognition operation such as a design value of a mark width required for performing the mark recognition operation are not appropriately set. In this case, by re-setting the processing parameters to the appropriate values, the position of the mark can be searched for without generating unnecessary mark detection errors.

From the point of view as described above, the necessity is increasing for an environment where analysis and evaluation of the mark search operation with respect to the waveform data is performed so that the cause of not being able to recognize the marks can be specified and the processing parameters can be adjusted. However, due to the large number of the above processing parameters existing, it is difficult to make the setting values of the processing parameters be appropriate if the processing parameters are randomly adjusted, and it also requires time.

SUMMARY OF THE INVENTION

The present invention has been made in consideration of the circumstances described above, and has as its first object to provide an evaluation system that evaluates a search operation of a detection subject using a photoelectric conversion signal, which is detected so as to correspond to an area including the detection subject.

In addition, the second object of the present invention is to provide an evaluation method in which a search operation of a detection subject using a photoelectric conversion signal detected so as to correspond to an area including the detection subject is evaluated.

According to the first aspect of the present invention, there is provided an evaluation system that obtains a photoelectric conversion signal by photoelectrically detecting an area to be detected including a detection subject on an object, and evaluates a search operation of the detection subject that uses the photoelectric conversion signal, the system comprising: an obtaining unit that obtains results of detection of the detection subject that uses the photoelectric conversion signal in the case the detection subject is assumed to be located at any potential position among a plurality of potential positions within the area to be detected that are a potential for a position of the detection subject; a specifying unit that specifies at least one potential position from among the plurality of potential positions, based on specifying information used to specify a potential position of the detection subject; and an evaluating unit that evaluates a search operation of the detection subject that uses the photoelectric conversion signal, based on the results of detection obtained by the obtaining unit assuming that the detection subject is located in the at least one potential position specified by the specifying unit.

Because the evaluation system comprises the obtaining unit that obtains the detection results of the detection subject in at least one of any potential positions, the specifying unit specifies at least one potential position from among a plurality of potential positions, which makes it possible to obtain the results of detection of the detection subject at the specified potential position and to evaluate the search operation of the detection subject that uses the photoelectric conversion signal based on the obtained results of detection.

According to the second aspect of the present invention, there is provided an evaluation method in which a photoelectric conversion signal is obtained by photoelectrically detecting an area to be detected including a detection subject on an object, and a search operation of the detection subject using the photoelectric conversion signal is evaluated, the method comprising: specifying at least one potential position where results of detection of the detection subject that uses the photoelectric conversion signal are obtained, from among a plurality of potential positions within the area to be detected that are candidates for a position of the detection subject; obtaining results of detection of the detection subject that uses the photoelectric conversion signal in the at least one potential position specified in the specifying; and evaluating a search operation of the detection subject that uses the photoelectric conversion signal, based on the results of detection obtained in the obtaining.

With the method, in the specifying process, at least one potential position where the detection results of the detection subject are obtained is specified based on the specifying information used to specify a potential position of the detection subject on the object, and in the obtaining process, the detection results of the detection subject that uses a photoelectric conversion signal is obtained in the case the detection subject is assumed to be located at the specified potential position. In this manner, the detection results of the detection subject can be obtained in at least one of any potential positions specified based on the specifying information, and in the evaluating process a search operation of the detection subject using the photoelectric conversion signal can be evaluated based on the detection results that have been obtained.

BRIEF DESCRIPTION OF THE DRAWINGS

In the accompanying drawings:

FIG. 4A is a view showing an example of raw waveform data obtained from imaging results of an alignment system AS;

FIG. 4B is a view showing a state where a starting point of a mark template is shifted by an edge potential unit;

FIG. 4C is a view showing a model of a buffer memory that stores results of performing mark recognition while shifting the starting point of the mark template by the edge potential unit;

FIG. 5 is a view showing a relation between an error code and an error factor;

FIG. 8 is a view showing an example of a waveform display window, a parameter setting window and the like;

DESCRIPTION OF THE EMBODIMENTS

A First Embodiment

Figure 1:
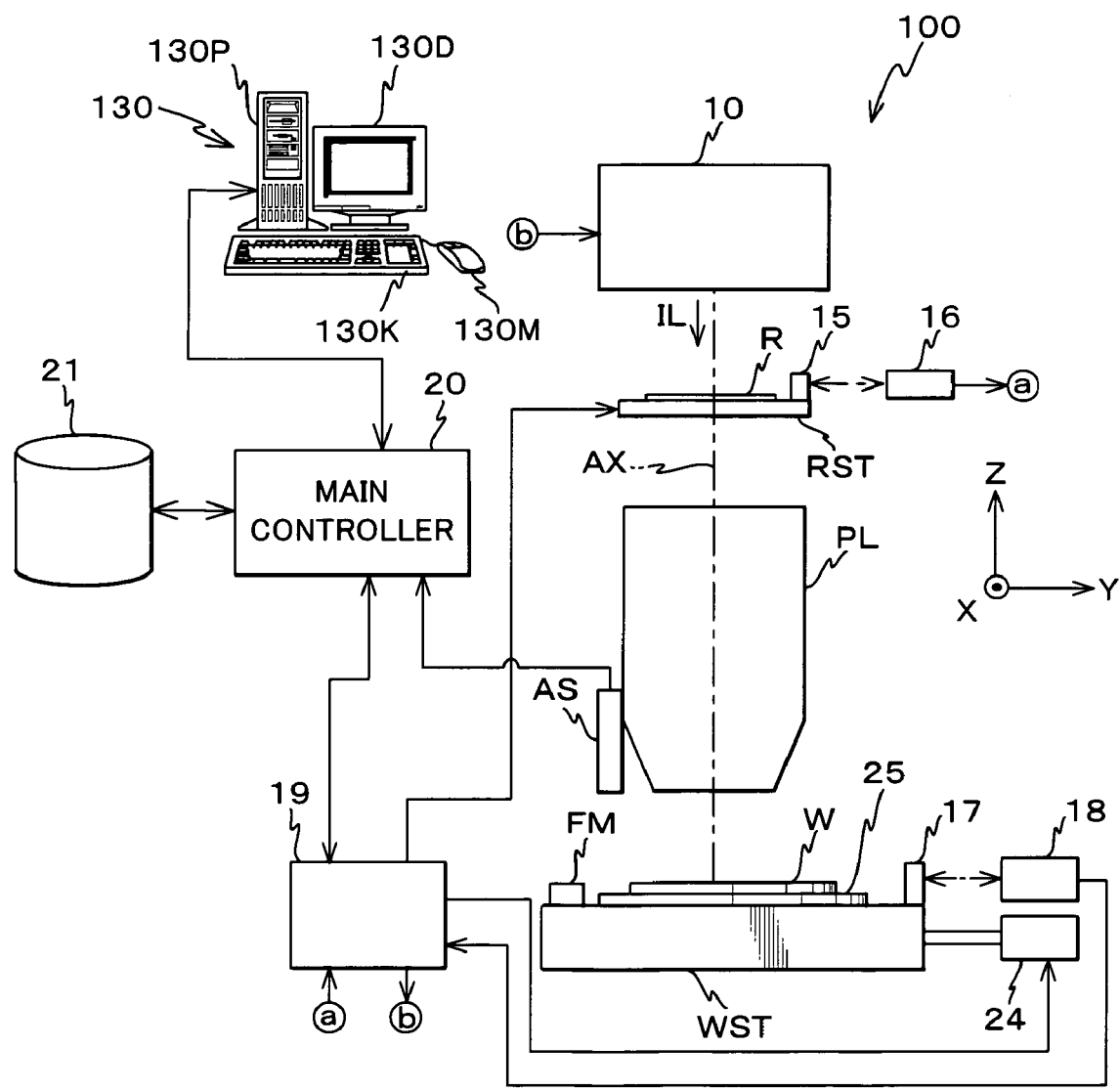
FIG. 1 is a view showing a schematic configuration of an exposure apparatus 100 related to a first embodiment of the present invention.

A first embodiment of the present invention will be described below, with reference to FIGS. 1 to 14. FIG. 1 shows an entire configuration of an exposure apparatus 100 that can suitably implement the evaluation method related to the first embodiment of the present invention. Exposure apparatus 100 comprises an illumination system 10, a reticle stage RST holding a reticle R, a projection optical system PL, a wafer stage WST on which a wafer W is mounted, a main controller 20 that performs overall control over the exposure apparatus, and the like. Exposure apparatus 100 is a scanning exposure apparatus.

As disclosed in, for example, Kokai (Japanese Unexamined Patent Application Publication) No. 2001-313250 (the corresponding U.S. Patent Application Publication No. 2003/0025890) and the like, illumination system 10 is configured including a light source, an illuminance uniformity optical system containing an optical integrator, a relay lens, a variable ND filter, a reticle blind (also called as a masking blade), a dichroic mirror and the like (none of which are shown). The above disclosures of the publication and the U.S. Patent Application Publication are incorporated herein by reference. Illumination system 10 illuminates a slit-shaped illumination area set by the reticle blind on reticle R where the circuit pattern or the like is fabricated, by an illumination light IL with substantially uniform illuminance.

As illumination light IL, far ultraviolet light such as the KrF excimer laser beam (wavelength: 248 nm), vacuum ultraviolet light such as the ArF excimer laser beam (wavelength: 193 nm) or the $F_2$ laser beam (wavelength: 157 nm) or the like is used. As illumination light IL, bright lines in the ultraviolet region generated by an ultra high-pressure mercury lamp (such as the g-line or the i-line) can also be used. Further, as the optical integrator, a fly-eye lens, a rod integrator (an internal reflection type integrator), a diffraction optical element or the like is used.

On reticle stage RST, reticle R is fixed, for example, by vacuum suction. Reticle stage RST is structured finely drivable in an XY plane perpendicular to an optical axis of illumination system 10 (coinciding with an optical axis AX of projection optical system PL, which will be described later) by, for example, a reticle stage drive section (not shown) that includes parts such as a linear motor, and is structured also drivable in a predetermined scanning direction (in this case, a Y-axis direction, which is the lateral direction of the page surface in FIG. 1) at a designated scanning speed.

The position of reticle stage RST within the reticle stage movement plane is constantly detected by a reticle laser interferometer (hereinafter referred to as 'reticle interferometer') 16 via a movable mirror 15 at a resolution of, for example, around 0.5 to 1 nm. Position information of reticle stages RST from reticle interferometer 16 is supplied to a stage controller 19 and to main controller 20 via stage controller 19. In response to instructions from main controller 20, stage controller 19 drives and controls reticle stage RST via the reticle stage drive section (omitted in the drawings) based on the position information of reticle stage RST. Incidentally, a pair of reticle alignment systems (not shown) is arranged above reticle R. The configuration of the pair of reticle alignment systems is disclosed in, for example, Kokai (Japanese Unexamined Patent Application Publication) No. 07-176468 and the corresponding U.S. Pat. No. 5,646,413 and the like, and therefore the detailed description is omitted here. The above disclosures of the publication and the U.S. Patent are incorporated herein by reference.

Projection optical system PL is arranged below reticle stage RST in FIG. 1, and the direction of optical axis AX of projection optical system PL is a Z-axis direction. As projection optical system PL, for example, a both-side telecentric reduction system is used. The projection magnification of projection optical system PL is for example, ¼, ⅕, ⅙ or the like. Therefore, when reticle R is illuminated with illumination light IL from illumination system 10, by illumination light IL passing through reticle R, a reduced image (a partial image) of a circuit pattern of reticle R within an irradiation area (the illumination area described earlier) of the illumination light is formed on wafer W whose surface is coated with a resist (a photosensitive agent), via projection optical system PL.

Wafer stage WST is arranged on a base (not shown) below projection optical system PL in FIG. 1, and is configured to be driven in the Y-axis direction and an X-axis direction (an orthogonal direction of the page surface in FIG. 1) orthogonal to the Y-axis direction in predetermined strokes by a wafer stage drive section 24 including parts such as a liner motor, and to be finely drivable in the Z-axis direction, a θx direction (a rotation direction around the X-axis), a θy direction (a rotation direction around the Y-axis) and a θz direction (a rotation direction around the Z-axis). On wafer stages WST, wafer holder 25 is mounted and wafer W is fixed on wafer holder 25 by, for example, vacuum suction or the like.

The position of wafer stage WST within the XY plane is constantly detected by a wafer interferometer 18 via a movable mirror 17 arranged on the upper surface of wafer stage WST, at a resolution of, for example, around 0.5 to 1 nm. In other words, in the first embodiment, a stationary coordinate system (an orthogonal coordinate system) that sets a moving position of wafer stages WST is set by the measurement axes of the Y interferometer and the X interferometer of wafer interferometer 18. In the following description, the stationary coordinate system is also referred to as a stage coordinate system. Position information (or velocity information) of wafer stage WST in the stage coordinate system is supplied to stage controller 19 and main controller 20 via stage controller 19. According to instructions of main controller 20, stage controller 19 controls wafer stage WST via wafer stage drive section 24 based on the position information (or velocity information) above of wafer stage WST.

Further, a fiducial mark plate FM is fixed in the vicinity of wafer W on wafer stage WST. The surface of fiducial mark plate FM is set to the same height as the surface of wafer W, and on the surface of the fiducial mark plate FM a fiducial mark for baseline measurement of an alignment system, which will be described later, a fiducial mark for reticle alignment and other fiducial marks are formed.

Further, on a side surface of projection optical system PL, an alignment system AS by an off-axis method is fixed. Alignment system AS has two types of alignment sensors, an LSA (Laser Step Alignment) system and an FIA (Field Image Alignment) system, and can measure the positions in the X and Y two-dimensional directions of the fiducial marks on fiducial mark plate FM and the alignment marks on the wafer. The LSA system is the most versatile sensor that irradiates a mark with a laser beam and measures a mark position using a diffracted or scattered beam. And, the FIA system is a sensor that illuminates a mark with a broadband light such as a halogen lamp and measures a mark position by performing an image processing of a mark image. Since details on alignment system AS having the configuration as is described above are disclosed in, for example, Kokai (Japanese Unexamined Patent Application Publication) No. 07-321028 and the like, a detailed description is omitted here. The above disclosure of the publication is incorporated herein by reference.

Further in exposure apparatus 100, a multiple focal point detection system based on an oblique method is fixed to a support section (omitted in the drawings) that supports projection optical system PL. The multiple focal point detection system is made up of an irradiation optical system (not shown) that supplies an image-forming beam for forming a plurality of slit images toward the best image-forming plane of projection optical system PL from an oblique direction with respect to an optical axis AX direction, and a photodetection optical system (not shown) that receives each image-forming beam reflected off the surface of wafer W via each slit. As the multiple focal point detection system, a system having a similar configuration to the one disclosed in, for example, Kokai (Japanese Unexamined Patent Application Publication) No. 06-283403 (the corresponding U.S. Pat. No. 5,448,332) or the like is used, and based on wafer position information from the multiple focal point detection system, stage controller 19 performs focus-leveling control of wafer W by finely driving wafer stage WST in the Z-axis direction and gradient directions (the θx direction and the θy direction) via wafer stage drive section 24. The above disclosures of the publication and the U.S. Patent are incorporated herein by reference.

Stage controller 19 performs a position control operation and the like of wafer stage WST and reticle stage RST, under instructions of main controller 20.

Main controller 20 is configured including a microcomputer or a workstation, and performs overall control over components of the exposure apparatus. Main controller 20 comprises a CPU that runs various programs for controlling operations of the exposure apparatus as well as an internal memory that stores the programs and various data, and the like (none of which are shown). In addition, main controller 20 is connected to a storage unit 21, and can read and write data with respect to storage unit 21. Furthermore, main controller 20 can send/receive data to/from a personal computer (PC) 130 via a communication network such as a LAN (Local Area Network).

PC130 is configured including a computer main body (hereinafter shortly referred to as a 'PC main body') 130P and a display 130D. PC130 is configured using a personal computer that operates under a predetermined operating system (hereinafter shortly referred to as an 'OS'), which supplies an operator with a graphic user interface (hereinafter shortly referred to as a 'GUI') environment operable by a pointing device such as a mouse.

PC main body 130P has a microprocessor and a memory (none of which are shown), a keyboard 130K, a keyboard interface (a keyboard controller) for connecting a mouse 130M, a video interface for connecting display 130D, a serial interface, a hard disk, a communication interface for supplying a communication network communicable with main controller 20 of exposure apparatus 100, and the like. And, to PC main body 130, keyboard 130K and mouse 130M serving as an input device and display 130D are connected. Further, in PC main body 130P, an application software (hereinafter shortly referred to as an 'application') for performing analysis and evaluation to a mark recognition operation described later performed in exposure apparatus 100 is installed. The applications ends/receives data files to/from main controller 20 constituting at least a part of exposure apparatus 100 via the communication network, for example, under FTP (File Transfer Protocol).

Incidentally, PC130 does not have to be a personal computer, and may be an exclusive board that realizes a human-machine interface of exposure apparatus 100.

<Exposure Operation>

Figure 2A:
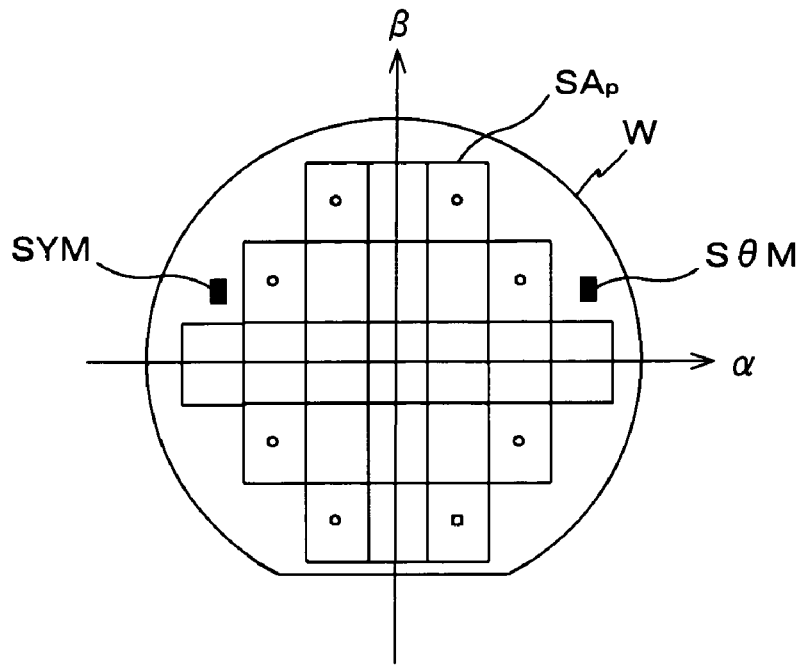
FIG. 2A is a view showing an example of a shot map of a wafer.
Figure 2B:
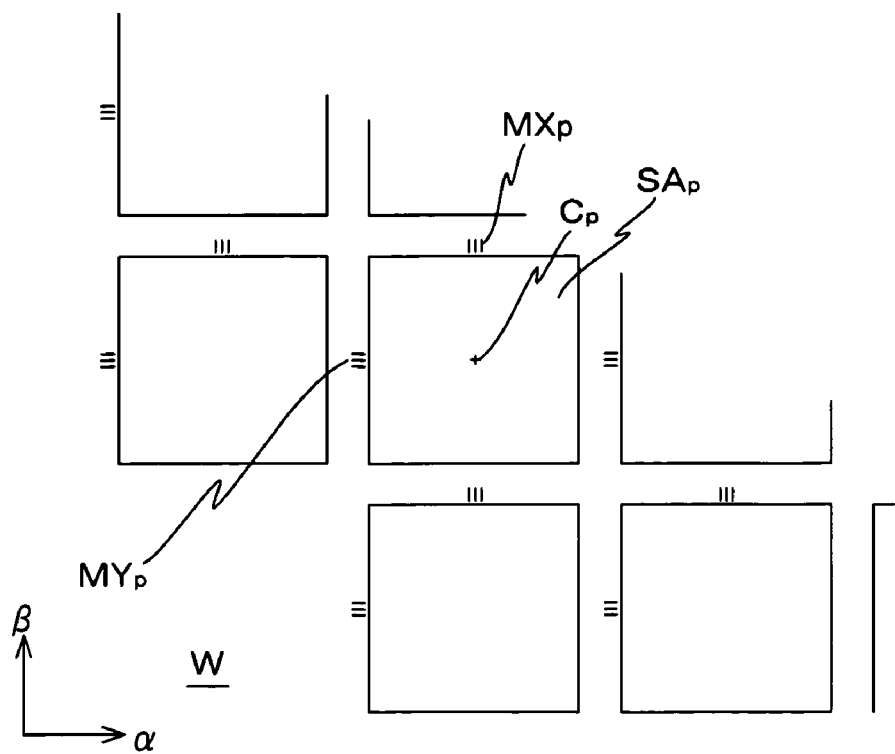
FIG. 2B is a view showing an example of wafer marks arranged in shot areas.

Next, a series of exposure operations in exposure apparatus 100 will be described. The exposure operations are performed under the control of main controller 20. As a premise, exposure of one or more layers of wafer W subject to exposure has been completed, and a plurality of shot areas $SA_p$ as shown in FIG. 2A have been formed on wafer W.

First, reticle R where a circuit pattern subject to transfer is formed is loaded on reticle stage RST by a reticle loader (not shown). Then, main controller 20 drives and controls wafer stage WST via stage controller 19 and wafer stage drive section 24, and after performing preparatory operations such as reticle alignment and baseline measurement using detection systems such as a reticle alignment detection system (not shown) and alignment system AS, wafer W subject to exposure is loaded on wafer stage WST by a wafer loader (not shown).

(Search Alignment)

Next, main controller 20 performs search alignment using alignment system AS. As is shown in FIG. 2A, in at least two points on wafer W, marks that can be observed with a low magnification, so-called search alignment marks (hereinafter shortly referred to as 'searchmarks') SYM and SθM are arranged. Main controller 20 gives a target position of wafer stage WST (a target position based on design position coordinates of search marks SYM and SθM, and the like) to stage controller 19 in order to sequentially locate each search mark within a detection field of alignment system AS. Stage controller 19 sequentially aligns wafer stage WST via wafer stage drive section 24 in accordance with the target position. Every time when performing the alignment, main controller 20 makes alignment system AS detect a photoelectric conversion signal that corresponds to an area including one of search marks SYM and SθM, and obtains the photoelectric conversion signal. Main controller 20 searches for marks within a waveform data using the photoelectric conversion signal, and computes position information of search marks SYM and SθM based on the search results. Since search marks SYM and SθM are marks that are transferred and formed in a state where a positional relation between the search marks and shot areas $SA_p$ has become fixed when shot areas $SA_p$ are transferred and formed, search marks SYM and SθM are formed according to an arrangement coordinate system (an αβ coordinate system in FIG. 2A) that sets the arrangement of shot areas $SA_p$. Main controller 20 computes a rotation component and an offset component of the arrangement coordinate system of shot areas $SA_p$ of the wafer with respect to the stage coordinate system, from the detected positions of search marks SYM and SθM.

Next, main controller 20 performs wafer alignment. As is shown in FIG. 2A, among a plurality of shot areas $SA_p$ that have been already formed on wafer W, circular-shaped marks appear in the center of eight shot areas $SA_p$ and the circular-shaped marks represent that eight shot areas $SA_p$ are sample shot areas whose position coordinates are to be measured in the wafer alignment. Main controller 20 gives a target position of wafer stage WST to stage controller 19 so that fine alignment marks (hereinafter shortly referred to as 'wafer marks') $MX_p$ and $MY_p$, which are arranged along in sample shot areas $SA_p$ corresponding to a center $C_p$ of sample shot areas $SA_p$ according to the arrangement coordinate system whose components have been obtained in the search alignment, are sequentially located within the detection field of alignment system AS. Stage controller 19 aligns wafer stage WST via wafer stage drive section 24 in accordance with the target position. Every time when performing the alignment, main controller 20 makes alignment system AS obtain a photoelectric conversion signal that is detected so as to correspond to an area including wafer marks $MX_p$ and $MY_p$ on the wafer, performs a mark search operation to search for wafer marks $MX_p$ and $MY_p$ using a waveform data based on the photoelectric conversion signal, and detects position information of wafer marks $MX_p$ and $MY_p$ based on the search results.

Figure 3:
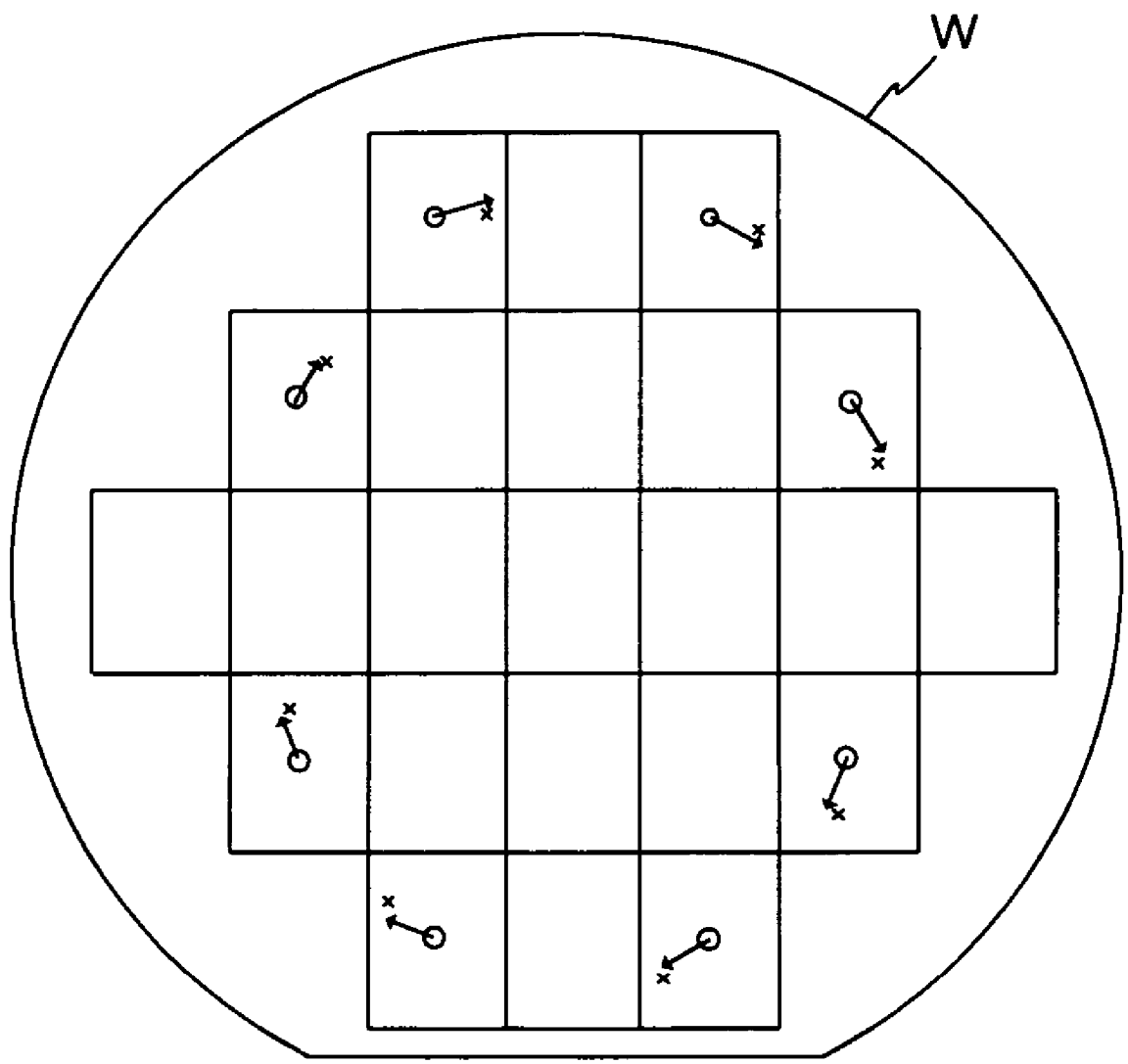
FIG. 3 is a view showing an example of an alignment correction amount and a residual difference in each sample shot area on a wafer.

The positions of wafer marks $MX_p$ and $MY_p$ are the same as the XY position of center $C_p$ of sample shot area $SA_p$ corresponding to wafer marks $MX_p$ and $MY_p$. In other words, when position information of wafer marks $MX_p$ and $MY_p$ is detected, this means that position information of sample shot area $SA_p$ is measured in the wafer alignment. In FIG. 3, the actual measurement positions of the wafer marks measured in this manner, that is, the XY positions of sample shot areas $SA_p$ are represented by 'x' on an image map of the shot areas of wafer W.

Next, main controller 20 executes a statistical calculation using the least-squares method disclosed in, for example, Kokai (Japanese Unexamined Patent Application Publication) No. 61-044429 and the corresponding U.S. Pat. No. 4,780,617 and the like, using the calculated position information of sample shot areas $SA_p$, and computes parameters of a scaling component, an offset component, an orthogonality-degree component and the like of the arrangement of shot areas in the stage coordinate system. The above disclosures of the publication and the U.S. Patent are incorporated herein by reference. The arithmetic expression set by the parameters is a so-called EGA model equation. The EGA model equation is a model equation in which when the design position coordinate of center $C_p$ of shot area $SA_p$ is assigned to the equation, a correction amount (an alignment correction amount) of the position coordinate of the center in the X-axis and Y-axis directions is obtained as an output. When performing overlay exposure, main controller 20 assigns the design position coordinate of each shot area on wafer W to the EGA model equation, computes an alignment correction amount of the shot area, and calculates a position coordinate corrected by the alignment correction amount as a datum position of overlay exposure to shot area $SA_p$.

In FIG. 3, an alignment correction amount in sample shot area $SA_p$ on the image map of shot area $SA_p$ of wafer W is represented by a vector. The base point of the vector represents the design position of shot area $SA_p$, and the end point represents the datum position after correction. As is shown in FIG. 3, although the tip of the vector of the alignment correction amount almost coincides with the actual measurement position of sample shot area $SA_p$, a slight deviation occurs in actual. This is because the EGA model equation to obtain the alignment correction amount is a model equation based on only a linear component such as scaling and rotation components, and is defined by a statistical method using the actual measurement position coordinate of sample shot area $SA_p$. A difference between the datum position for overlay corrected by the alignment correction amount and the actual measurement position coordinate of sample shot area $SA_p$ is referred to as a residual difference hereinafter.

When completing the wafer alignment, the alignment correction amount of each sample shot area, data of the position coordinates of the sample shot areas after correction that has been calculated based on the alignment correction amount, and data of residual difference of the sample shot areas are stored in storage unit 21 respectively.

After the completion of the wafer alignment as described above, an exposure operation based a step-and-scan method is performed as follows.

When performing the exposure operation, first of all, main controller 20 moves wafer stage WST based on the wafer alignment results and the measurement results of the baseline via stage controller 19 and wafer stage drive section 24 so that the XY position of wafer W is at a scanning starting position for exposing a first shot area (a first shot). Simultaneously, main controller 20 moves reticle stage RST via stage controller 19 and reticle stage drive section (not shown) so that the position of reticle R is at the scanning starting position. Then, scanning exposure is performed to a first shot area $SA_p$ by irradiating illumination light IL by illumination system 10 in a state where reticle stage RST and wafer stage WST are synchronously moved by position control of stage controller 19.

When the transfer of a reticle pattern to the first shot area $SA_p$ is completed, wafer stage WST moves to a scanning starting position for a second shot area, and at the same time reticle stage RST moves to a scanning starting position for the second shot area, and then scanning exposure is performed in the same manner as in the case of the first shot area described above. In this manner, movement of wafer stage WST to the scanning starting position for the next shot area and movement of reticle stage RST to the scanning starting position for the next shot area, and scanning exposure are sequentially repeated, and patterns of the required number of shots are transferred onto wafer W.

As is described above, in the series of exposure operations to wafer W, the search alignment and the wafer alignment are performed. In each alignment, alignment system AS is made to detect photoelectric conversion signals corresponding to the areas on wafer W including search marks SYM and SθM and fine alignment marks $MX_p$ and $MY_p$ in sample shot areas $SA_p$, and marks are searched for within waveform data corresponding to the photoelectric conversion signals (a mark search operation), then position information of the marks is calculated based on the search results. In the following description, the mark search operation is specifically explained.

As is described earlier, in alignment system AS, two sensors based on the FIA method and the LSA method are prepared. Either sensor can be selected so as to obtain a photoelectric conversion signal corresponding to an area including marks detected by the selected sensor, however, in this case, the FIA sensor is to be selected. As in the description later on, the photodetection conversion signal becomes a one-dimensional signal waveform data in the X-axis direction or the Y-axis direction. Main controller 20 searches for marks in the waveform data using a predetermined search algorithm, and detects the position information of each mark based on the search results.

An example of a search algorithm will be described below. In the following description, the case will be described where a line-and-space (L/S) mark placed along the Y-axis direction is searched, based on the one-dimensional waveform data, and the Y-position of the mark is computed based on the search results.

The photoelectric conversion signal detected by the sensor based on the FIA method is the imaging result (the imaging data) of an area including each L/S mark on wafer W. In the search algorithm, first, with respect to the imaging data sent from alignment system AS, white noise is canceled out by obtaining the mean of an intensity distribution on a plurality of scanning lines in the Y-axis direction, and then by performing smoothing of the waveform (a smoothing processing), a one-dimensional average signal intensity distribution is obtained. The signal intensity distribution is to be the signal waveform data for searching the marks. FIG. 4A shows a waveform data function p(Y) as an example of the waveform data.

(Differentiation of Waveform Data)

Main controller 20 calculates a differential waveform of the above signal intensity distribution. FIG. 4B shows a differential waveform p'(Y) of waveform data function p(Y) in FIG. 4A.

(Extraction of Edge Potential Positions)

As is shown in FIG. 4B, in differential waveform p'(Y), several peaks appear, which seem to correspond to edges that are the boundaries between line patterns and space sections of the L/S marks. In the differential waveform, main controller 20 extracts the positions having peaks equal to or greater than a contrast limit value, as potential positions that are potentials for a position where a pattern edge section (i.e. edge) within the L/S mark exists. In FIG. 4B, a plurality of potential positions is shown with vertical dashed lines.

(Mark Recognition Operation)

Next, with respect to each of a plurality of edge potential positions extracted as described above, an operation for judging whether or not the L/S mark can be recognized, a so-called mark recognition operation is performed. In the following description, the mark recognition operation will be described.

In the mark recognition operation, a mark is recognized using a mark template waveform that is based on design information of the L/S mark. Specifically, by checking how much the mark template waveform is correlated to a section of the waveform data corresponding to the mark template waveform (i.e. a section within a frame of the mark template waveform), in a state where the edge at a −Y end of the mark template waveform is to be a starting point and the starting point is made coincident with a specific edge potential as shown in a bold arrow in FIG. 4B, the judgment is made of whether or not the mark can be recognized at the position.

First, the total number of edges in the section within the frame of the mark template waveform is obtained, and the judgment is made of whether or not the number of edges is smaller than the set number of edges. When the judgment is affirmed, it is regarded that the mark cannot be recognized and an errorcode01 is set as an error code representing an error factor. The error code will be described later.

Incidentally, because it is considered that the mark exists in the vicinity of the center of the waveform data, a measurement range (an operation range) is set and the range for performing the mark recognition operation is restricted to some extent. In FIG. 4B, the boundary of the measurement range is indicated with vertical double lines. Next, in the first embodiment, the judgment is made of whether or not the edge within the frame of the mark template protrudes outside the operation range. When the judgment is affirmed, it is regarded that the mark cannot be recognized and an errorcode02 is set as an error code.

In addition, the judgment is made of whether or not the intensity of the edge within the frame of the mark template is equal to or less than a predetermined intensity. When the judgment is affirmed, it is regarded that the mark cannot be recognized and an errorcode03 is set as an error code.

Furthermore, the judgment is made of whether or not the direction of the edge intensity is same as the direction of the next edge intensity within the frame of the mark template. When the judgment is affirmed, it is regarded that the mark cannot be recognized and an errorcode04 is set as an error code.

In the case all of the above judgments are denied, an edge potential position corresponding to each edge position of the mark template can be determined, and therefore a score representing the recognition degree of the mark is calculated based on the determined edge potential position.

The score is an index value that shows how accurate the waveform data within the frame of the mark template reproduces the characteristics of the mark. In the first embodiment, the divergence of the characteristic of the mark in the actual waveform data from the design characteristic of the mark is obtained as a characteristic amount, and the score is calculated based on the characteristic amount. As characteristics of the L/S mark, for example, a width of each line pattern (a mark width), a distance between line patterns (a mark distance), an edge shape of a boundary between each line pattern and space section, and the like are given. In this case, a characteristic amount corresponding to each of these characteristics is computed.

First, the sum of an error between a design value of the distance between each of the line patterns of the L/S mark (the distance between the line patterns of the template) and distance between each of the line patterns assumed from the edge potential position is computed (this is to be a characteristic amount 1). Next, the sum of an error between a design value of the width of each of the line patterns of the L/S mark and the width of each of the line patterns assumed from the edge potential positions is computed (this is to be a characteristic amount 2). Then, a characteristic amount related to 'uniformity of the edge intensity' is obtained by computing a standard deviation of peak values (this is to be a characteristic amount 3). And, the weighted sum of these characteristic amounts is obtained. The value of the weighted sum is to be the score of a combination of these edge potential positions.

Next, the computed score is compared with a threshold value set in advance, and when the score is better than the threshold value, it is regarded that the mark can be recognized, and when this is not the case, it is regarded that the mark cannot be recognized.

In this case, when the score is not better than the threshold value and it is regarded that the mark cannot be recognized, the factor is analyzed.

First, the judgment is made of whether or not characteristic amount 1 exceeds a limit set in advance. When the judgment is affirmed, it is regarded that the factor causing the mark not to be recognized is that the mark distance error exceeds the limit, and an errorcode05 is set as the error code.

Next, the judgment is made of whether or not characteristic amount 2 exceeds a limit set in advance. When the judgment is affirmed, it is regarded that the factor causing the mark not to be recognized is that the mark width error exceeds the limit, and an errorcode06 is set as the error code.

Besides the ones described above, the judgment is also made such as whether a balance of a mark edge distance exceeds a limit set in advance, whether a balance of the mark edge intensity based on characteristic amount 3 exceeds a limit set in advance, whether deviation of the edge intensity between the line marks exceeds a limit set in advance and whether the number of detected edges of each line pattern is smaller than the set edge number set in advance. When each judgment is affirmed, a factor causing the mark not to be recognized is specified, and a code is set (errorcode07 to 0A) for the specified factor as an error code of each error factor.

In this manner, error factors are segmentalized to some extent by the analysis and are encoded. FIG. 5 shows a table showing a relation between the error codes and the error factors.

As is described above, in the mark recognition operation where operation is performed with the starting point of the mark template being made to coincide with any one of the edge potential positions, when a value of the score based on the characteristics of the mark computed during the operation is better than the threshold value, mark recognition is regarded successful. However, in the case there are not enough edges to make the score computation possible, or the characteristics of the waveform within the frame of the mark template is significantly different from the characteristics of the mark, a mark detection error is generated because the mark recognition is regarded as a failure. Such mark recognition result, that is, the score or the error code, is stored in a buffer memory b[0].

Next, as is shown in FIG. 4B, the mark recognition operation described above is performed again in a state where the starting point of the mark template is shifted to the second edge potential position, and the recognition result (the score, the error code) are stored in buffer memory b[1]. Afterwards, in the manner described above, the mark recognition operation using the mark template is performed each time the starting point of the mark template is shifted in a +Y direction one by one, and the recognition results are sequentially stored in buffer memory b[i] (i=2, 3, . . . ). FIG. 4B shows a model of how the mark template is shifted in the +Y direction, and FIG. 4C shows an example of the recognition result (the score, the error code) of the mark recognition operation stored in each buffer memory b[i]. Data stored in each buffer memory b[i] (buffer memories b[0] to b[23] in FIG. 4C) is stored in storage unit 21.

Main controller 20 performs the mark recognition operation at each edge potential position using the mark recognition algorithm described above, and obtains the mark recognition result at each edge potential position. Then, main controller 20 determines the edge potential position that has the best score from among a plurality of edge potential positions, and the center position of the mark having a predetermined offset from the determined edge potential position is computed as the position of the mark. Incidentally, in the first embodiment, because the left end edge of the mark template waveform serves as the starting point of mark recognition, the predetermined offset is to be a design distance between the left end edge and the center of the mark.

Main controller 20 makes a data file in which position information of the search marks in the case the detection of the waveform data, the score and the mark is successful, and information related to error codes and the like in the case the detection of the marks is failed are written, along with data such as the lot number to which the wafer belongs, the wafer number, recognition parameters (the FIA method or the LSA method, design values of widths and distances of line patterns and the like, the algorithm number, a processing parameter for each algorithm number) used for the mark recognition operation in alignment system AS. The data file is made as an alignment history data file, and the alignment history data file is stored in storage unit 21. With this operation, the mark search operation is completed.

Main controller 20 performs search alignment or wafer alignment based on position information of search marks SYM and SθM or wafer marks $MX_p$ and $MY_p$ that has been obtained using the mark search operation as is described above. On the search alignment or the wafer alignment, in the case a mark cannot be recognized at any edge potential position, a mark detection error is generated.

Incidentally, the error check order in the mark recognition algorithm described above is not limited to the above-described order, and can be changed appropriately.

(Evaluation of Mark Recognition Operation)

As is described above, in the first embodiment, a mark is searched for by performing the mark recognition operation at a plurality of edge potential positions within the one-dimensional waveform data, and based on the position coordinate of a mark detected as a result of the search, a datum position when performing overlay exposure is obtained. Accordingly, in order to perform overlay exposure with high accuracy, it is essential to recognize the mark appropriately when searching the mark, and therefore it is desirable to build a mechanism for evaluating the mark recognition operation. For the reason, in the first embodiment, an application for evaluating the mark recognition operation is operable on PC130. In the following description, the application will be described.

Figure 6:
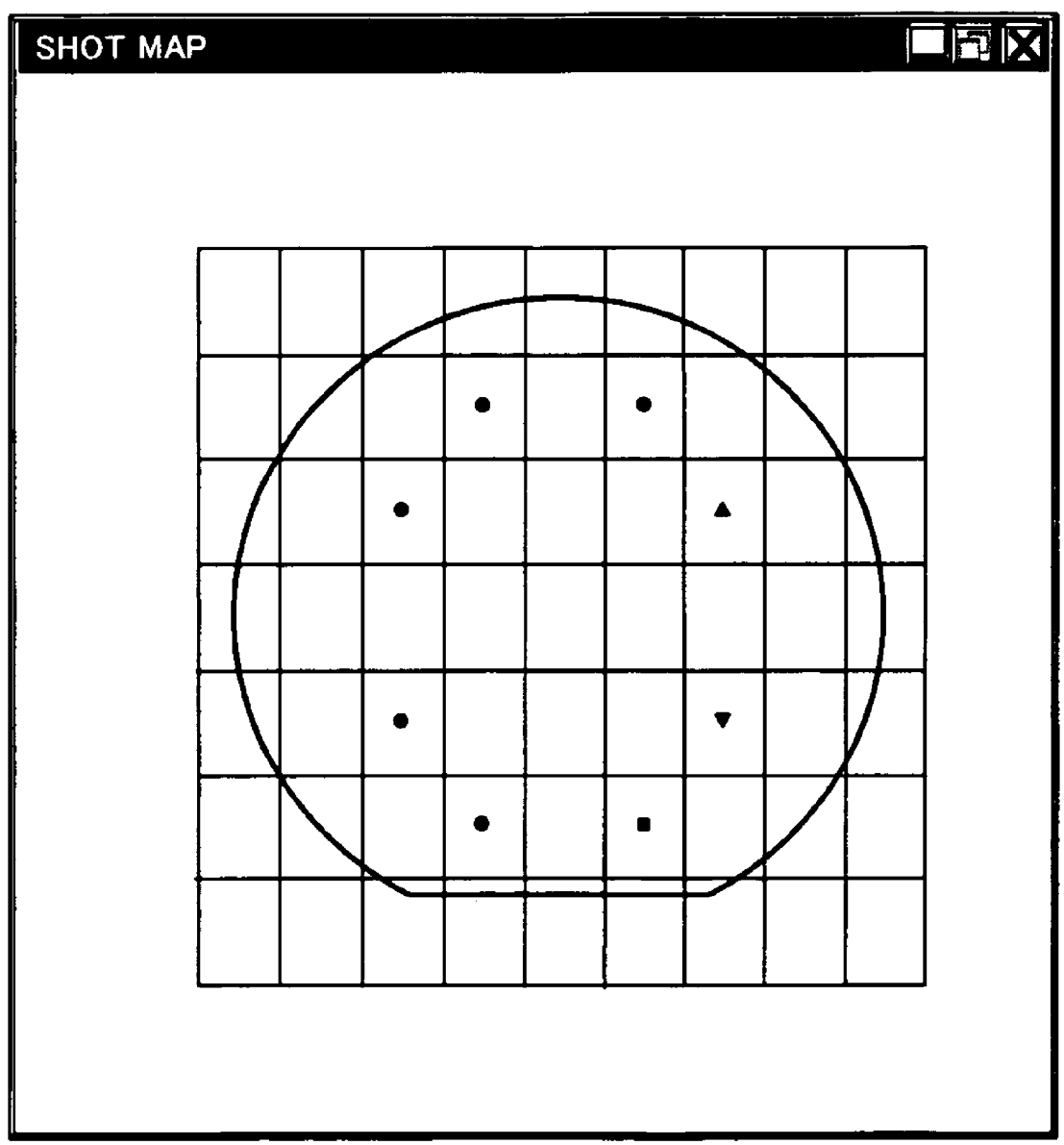
FIG. 6 is a view showing an example of a mark detection result displayed on the display.

Incidentally, as a premise, the above application for evaluating the mark recognition operation in exposure apparatus 100 has already been started in PC130. In this state, when an operator specifies a product name, a lot name, the wafer number, and the layer number via mouse 130M or keyboard 130K, the application as a FTP (File Transfer Protocol) client sends a connection request to main controller 20 (a FTP server) of exposure apparatus 100. When the connection request is approved, then, the application sends a directory display request to main controller 20. When receiving the directory display request, main controller 20 reads out the alignment history data related to the designated layer of the designated wafer from storage unit 21 and sends the alignment history data to PC130. The application receives the alignment history data, and then within a window shown on display 130D, makes display 130D display an image of a shot map of the specified wafer and a window for showing the alignment history data. FIG. 6 shows an example of the window display.

On the screen shown in FIG. 6, an image view of the shot map on wafer W specified by the operator is displayed, and cells in a matrix arrangement are displayed on the image view of shot areas $SA_p$ of wafer W. These cells represent shot areas $SA_p$ formed on the wafer. Marks are displayed in some cells, and the cells in which the marks are displayed represent sample shot areas.

Viewing further in detail, as a mark in each cell, a circular mark, a triangle (an upper-peaked triangle) mark, an inverted triangle (a lower-peaked triangle) mark, and a square mark are displayed. The circular mark represents that sample shot area $SA_p$ is a sample shot area where a mark detection error is not generated for both wafer marks $MX_p$ and $MY_p$ and detection of position information of the mark is successful. The triangle mark represents that sample shot area $SA_p$ is a sample shot area where detection of wafer mark $MX_p$ is successful but detection of wafer mark MYP has failed and a mark detection error is generated. The inverted triangle mark represents that sample shot area $SA_p$ is a sample shot area where detection of wafer mark MYP is successful but detection of wafer mark $MX_p$ has failed and a mark detection error is generated. The square mark represents that sample shot area $SA_p$ is a sample shot area where a mark detection error is generated for both wafer marks $MX_p$ and $MY_p$. Incidentally, besides wafer marks $MX_p$ and $MY_p$, marks corresponding to search marks SYM and SθM also are to be displayed, though they are not shown in FIG. 6.

In other words, on the screen of the application, it is displayed whether the detection of position information of wafer marks $MX_p$ and $MY_p$ arranged in a plurality of sample shot areas $SA_p$ formed on wafer W is successful or not. The application, as the FTP client, obtains the detection results of position information of a plurality of sample shot areas $SA_p$ on wafer W from main controller 20, and makes display 130D display on the screen the obtained detection results of position information of a plurality of sample shot areas $SA_p$ together with the image display (a cell display) of the shot map of a plurality of shot areas $SA_p$ on wafer W.

Various types of marks displayed on the cells are objects that generate an event to make the application display a new window by a click operation of mouse 130M. For example, when an operator operates mouse 130M and selects any mark within the samples shot areas, the object issues a command message to the OS that the mark is selected. The OS operating on PC130 posts the command message to a message queue of the application. A main routine of the application obtains the message and opens the CPU to the OS by performing a so-called dispatch. The OS calls up a window procedure of the application and passes the command message along with information that the object is selected, as accompanying information, to the window procedure. The window procedure executes a message handler corresponding to a relevant pull-down menu, referring to the accompanying information.

Figure 7:
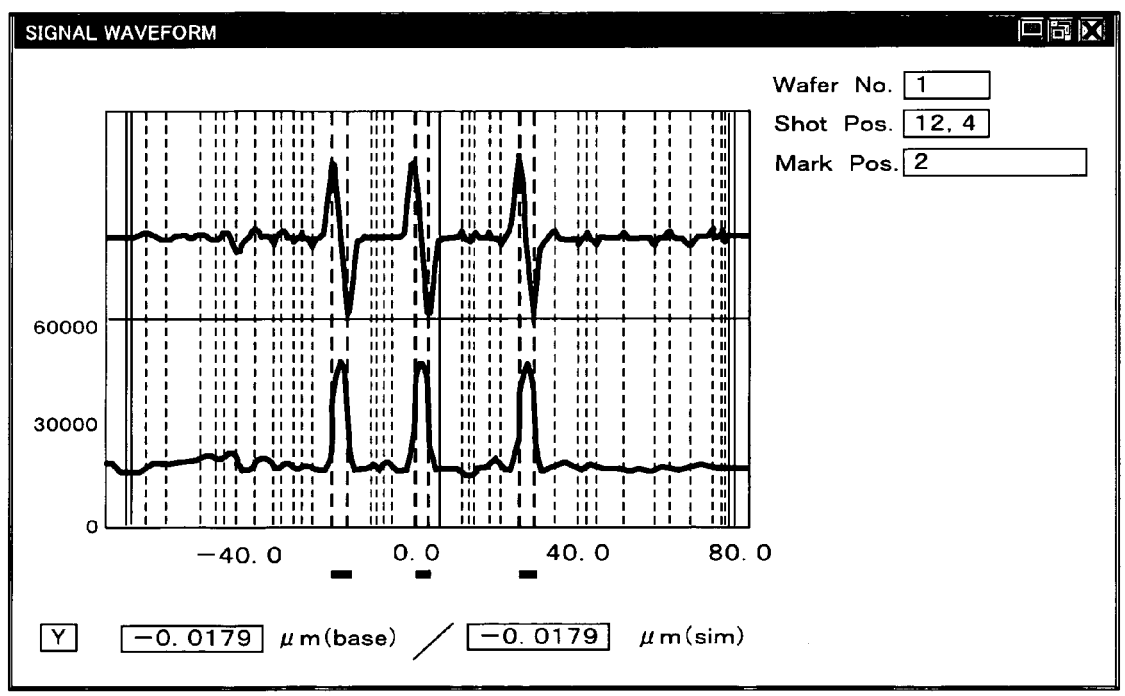
FIG. 7 is a view showing an example of a waveform display window.

On the screen of display 130D, a window is displayed as shown in FIG. 7. In this window, a waveform data is graphically displayed that corresponds to a photoelectric conversion signal obtained by alignment system AS and corresponding to an area including wafer mark $MX_p$ or wafer mark $MY_p$ in a sample shot area. Since 'Y' is specified in a text box at the lower left of the window in FIG. 7, the waveform data of wafer mark $MY_p$ is displayed in this case. This window is called as a waveform display window.

In FIG. 7, two waveform data are displayed, and the waveform data on the lower side is raw waveform data corresponding to the photoelectric conversion signal obtained by alignment system AS. In the following description, this waveform data is called as 'raw waveform data'. The raw waveform data is equivalent to waveform data function p(Y) in FIG. 4A.

On the upper side of the 'raw waveform data', a waveform of differential waveform data of the raw waveform data that is made in the mark search operation is displayed. And, a plurality of edge potential positions calculated based on peaks of the differential waveform data p'(Y) are represented in vertical dashed lines extending across the raw waveform data and the differential waveform data. This differential waveform data is equivalent to waveform data function p'(Y) in FIG. 4B.

On the right side of a waveform display frame of the two waveform data, a wafer number of the selected wafer (wafer No.), an arrangement number of the sample shot area (Shot Pos), design position information of the alignment mark (Mark Pos) are displayed. Further, below the two waveform data, as is described earlier, a text box is displayed for the operator to select whether a mark whose sample shot area's raw waveform data is displayed is to be a position detection mark in the X-axis direction or a position detection mark in the Y-axis direction. When the operator specifies 'X' in the text box by operating mouse 130M and keyboard 130K, the waveform data displayed switches to raw waveform data and its differential waveform data of wafer mark $MX_p$.

When the operator clicks the waveform data using mouse 130M, a vertical line passing though the point is displayed, and also a position coordinate of the point is displayed. Incidentally, the vertical line corresponds to the center of the mark template displayed below the raw waveform data.

Figure 8:
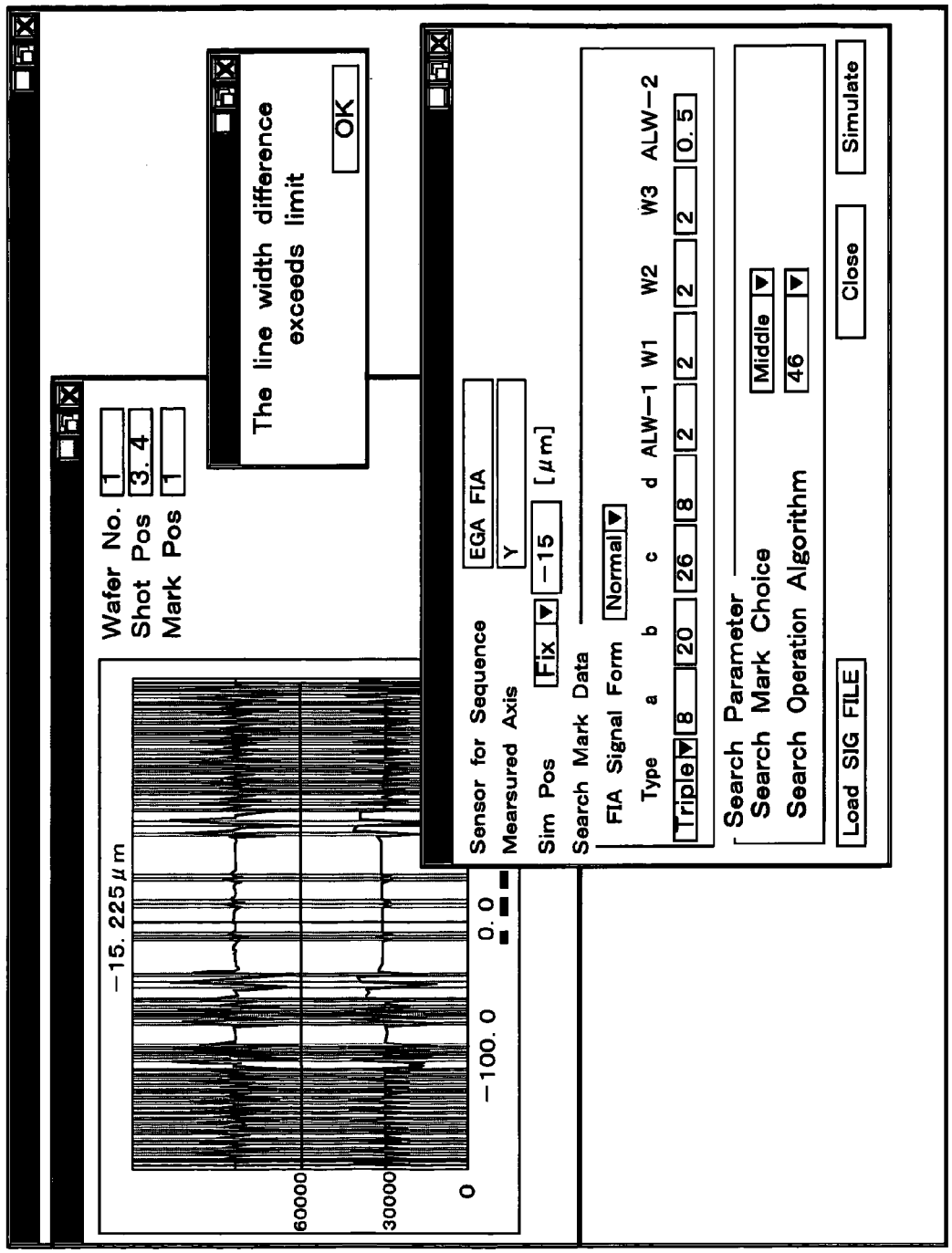

As is shown in FIG. 8, on the screen of display 130D, besides the waveform display window, a parameter setting window is displayed at the lower right side of the screen. The parameter setting window is a window to set processing parameters necessary for performing a mark recognition operation to the waveform data displayed in the waveform display window.

In the parameter setting window, a display field of 'Sensor for Sequence' and a display field of 'Measured Axis' are shown from above, and 'EGA FIA' and 'Y' are displayed in the respective display fields. By the display of 'EGA FIA' and 'Y', the operator can recognize that the waveform data displayed in the waveform display window is the waveform data related to the Y-axis direction when wafer mark MYP obtained by a sensor of the FIA method of alignment system AS is a measurement subject. A display field of 'Sim Pos' shown below these display fields will be described later.

Various setting fields shown in a frame of 'Search Mark Data' below the display field of 'Sim Pos' are setting fields that are mainly used for setting design information of a search mark. First, in a setting field of FIA signal waveform that sets a characteristic of a waveform shape of the mark, 'Normal' is designated, which shows that the type of shape of the signal waveform is a normal type. In the case the waveform of the mark is a reverse polarity waveform shape due to conditions such as process types or the reflectivity of a base around the mark, 'Reverse' may be specified. Further, in a 'Type' setting field for setting a type of the mark, 'Triple' is set, which shows that the mark is a line-and-space mark made up of three line marks. On the right side of the setting field, text boxes of setting fields 'a' to 'd' for setting the distance between marks (a mark pitch) are displayed. A setting field ALW-1 for setting a mark pitch limit, setting fields W1 to W3 for setting widths of the marks, and a setting field ALW-2 for setting a mark width limit (text boxes) are displayed in this order.

Below a frame of 'Search Mark Data', a frame of 'Search Parameter' is displayed. In this frame, setting fields for mark recognition parameters used in the mark recognition operation are displayed. In this case, the selection of a search mark that is to be detected from the search signal waveform (Search Mark Choice), the algorithm number that is applied to a waveform processing of the search mark (Search Operation Algorithm) are displayed. In an example shown in FIG. 8, 'Middle' and '46' are selected.

At the lower left side of the window, a button 'Load SIG FILE' is displayed. By clicking the button by operating mouse 130M, setting values of various parameters that have been set on actual alignment are read out from the alignment history data and displayed in the frames of 'Search mark Data' and 'Search parameter' within the window. In FIG. 8, a state is shown where the 'Load SIG FILE' button is clicked and the setting of various parameters used in the actual alignment is displayed. As is shown in FIG. 8, for example, in the mark parameter frame, 'Triple' is displayed in the 'Type' setting field, '8, 20, 26 and 8 [μm]' are displayed in the mark pitch setting fields 'a' to 'd' respectively, '2 [μm]' is displayed in the mark pitch limit ALW-1, '2 [μm]' is displayed in the mark width setting fields W1, W2, and W3, and '0.5 [μm]' is displayed in the mark width limit ALW-2.

At the lower right side of the window, a button 'Simulate' is displayed. By clicking the 'Simulate' button by operating mouse 130M, a simulation of mark recognition operation is executed using the parameters displayed in the parameter setting window. In the simulation of the mark recognition operation, an operation that is equivalent to the mark recognition operation in exposure apparatus 100 described above, that is, an error check of error codes 01 to 0A and score calculation are performed.

The operator refers to the waveform data displayed in the waveform display window and various parameters displayed in the parameter setting window, and performs evaluation and analysis of the mark recognition operation.

When clicking the waveform data displayed in the waveform display window using mouse 130M, a position coordinate of the position that has been clicked is set in the setting field (Sim Pos.) for setting a position coordinate in the parameter setting window. The set position is the position designated by the operator. In the example shown in FIG. 8, '−15 [μm]' is set in this setting field. The text-entered position coordinate serves as the specifying information in the first embodiment. 'Fix' is the setting for determining whether to activate this text box or not, and the text box becomes active by setting 'No Fix'. Incidentally, the position coordinate of the clicked position is displayed in the waveform display window, and the operator may set the position coordinate to the 'Sim Pos.' using keyboard 130K referring to the displayed position coordinate. Further, the operator may directly input a position coordinate of the starting point of the edge to the 'Sim Pos.' based on the design position coordinate of the mark.

Figure 9:
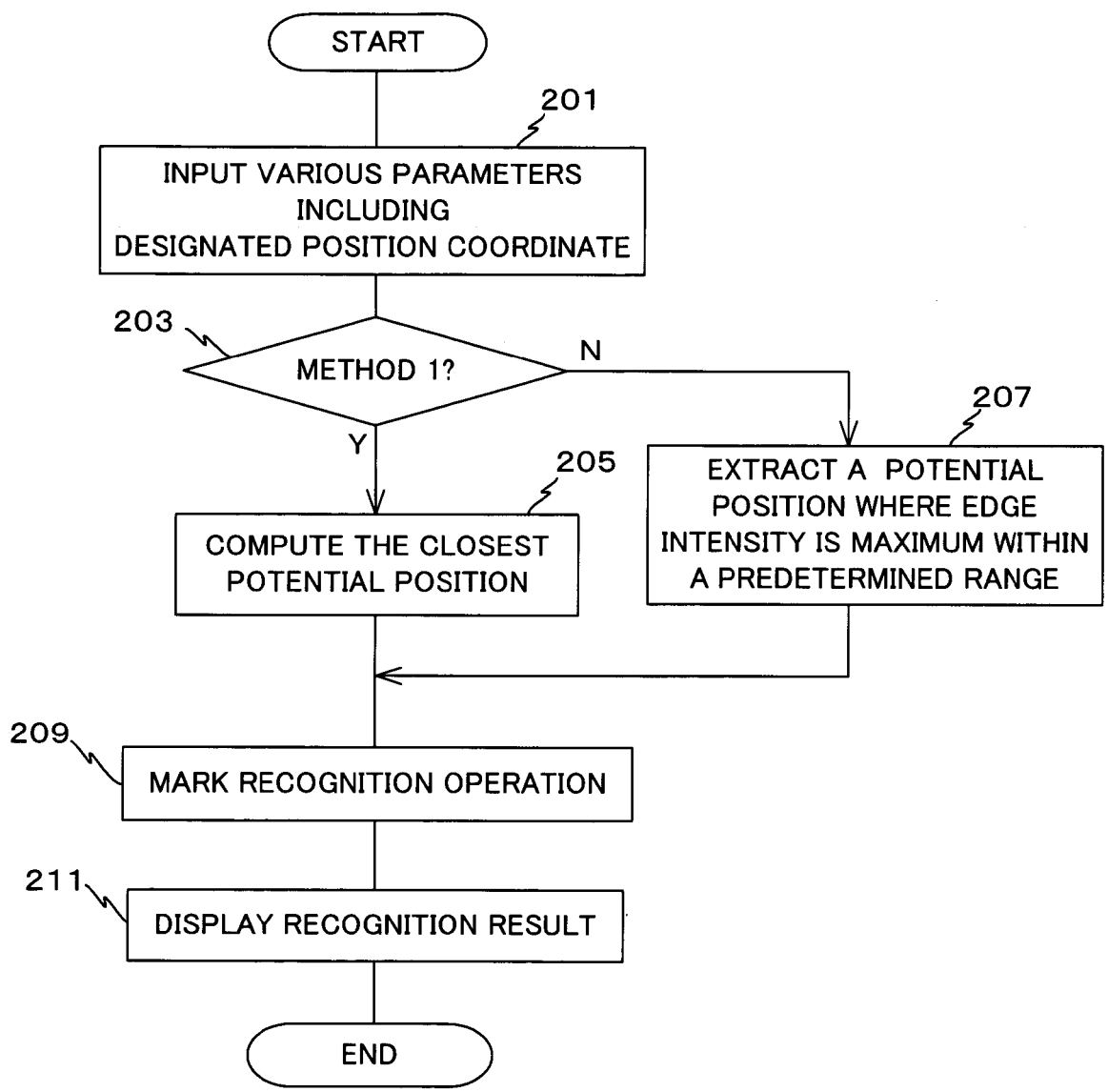
FIG. 9 is a flowchart showing a simulation processing of a mark recognition operation in the first embodiment of the present invention.
Figure 10A:
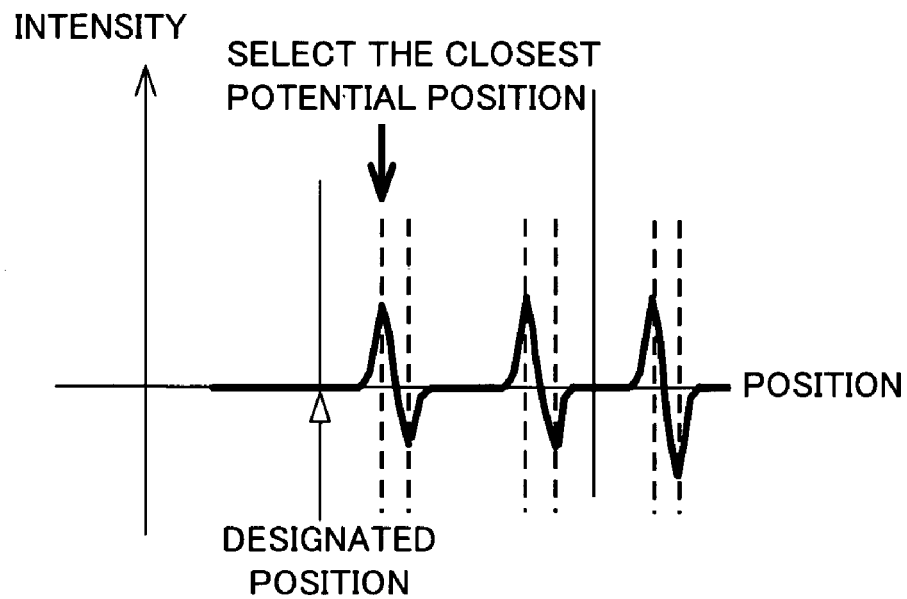
FIG. 10A is a view showing a method (No. 1) for specifying an edge potential position.
Figure 10B:
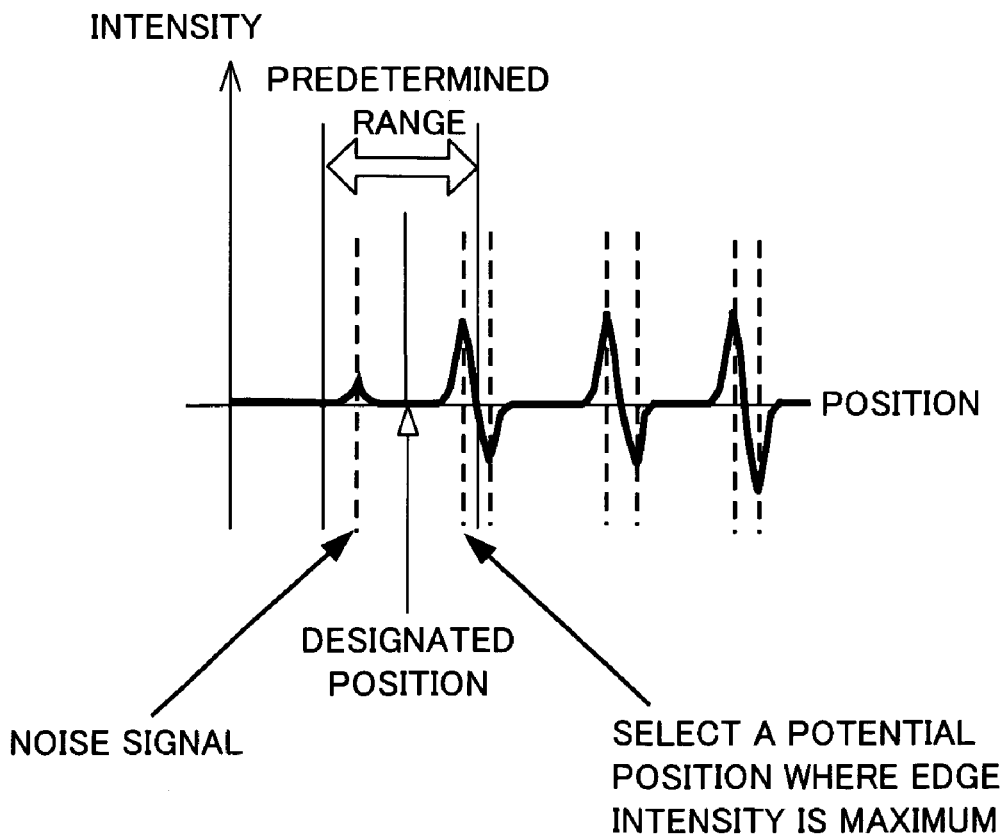
FIG. 10B is a view showing a method (No. 2) for specifying an edge potential position.

When clicking the 'Simulate' button in this state, the application starts a processing shown in FIG. 9. As is shown in FIG. 9, first in step 201, setting values of various parameters set in the parameter setting window that include the position coordinate designated in the 'Sim Pos.' are inputted in the internal memory.

The position coordinate designated in the 'Sim Pos.' is specifying information for specifying an edge potential position where a mark recognition operation is performed, and there are two main methods as methods to specify the edge potential position for performing the mark recognition operation based on the specifying information. Firstly, as is shown by an example of search alignment waveform of a three-lines mark in FIG. 10A, a method is available in which the edge potential position closest to the designated position is specified as a position where a mark recognition operation is performed. Secondly, as is shown by an example of search alignment waveform also of the three-lines mark in FIG. 10B, a method is available in which the edge position where the intensity of the edge is maximum is selected from among the edge potential positions within a predetermined range having the designated position as a datum. In this case, a starting point edge position of a mark to be detected can be picked up without picking up a noise signal within a predetermined range. In the following description, the former method will be referred to as a method 1 and the latter method will be referred to as a method 2. As a predetermined range in method 2, for example, a value of about a width of one line pattern can be set in wafer alignment, and a value of about 3 to 5 times of a width of one line pattern can be set in search alignment, however, any value may be set.

Referring back to FIG. 9, in the next step, step 203, the judgment is made of whether or not method 1 is used. The method to be selected is to be set by the operator in advance. When the judgment is affirmed, the procedure proceeds to step 205, and when the judgment is denied, the procedure proceeds to step 207. In step 205, method 1 is executed and in step 207, method 2 is executed. Normally, it is assumed that method 1 is mainly used when performing manual assist and method 2 is mainly used when performing automatic adjustment in a lot operation. However, either method may be used in either of the manual assist or the automatic adjustment. In the example shown in FIG. 8, when the position designated by the operator was at −15 μm, the specified edge potential position was at −15.225 μm.

After the procedures in step 205 or step 207 are executed and the edge potential position for performing the mark recognition operation is specified, then in step 209 the mark recognition operation at the specified edge potential position is performed. By this operation, the mark recognition result (a value of a score in the case the mark recognition succeeds, and an error code in the case the mark recognition fails) at the specified edge potential position can be obtained.

In the next step, step 211, the recognition result of the mark recognition operation at the edge potential position is displayed. In the case the mark recognition is successful, the success in the mark recognition and also the value of the score are displayed, and in the case the mark recognition has failed, an error factor is displayed. In the example shown in FIG. 8, a popup window is displayed separately from the waveform display window and the parameter setting window, and an error factor (that a line width difference exceeds a limit) is displayed in the window. Further, in the waveform display window, as is shown in FIG. 8, the position coordinate of the center of the mark that has been detected when the mark recognition operation has been performed is displayed, and as is shown in FIG. 7, the edge potential positions used for the mark recognition operation are represented by bold dashed lines so that they are identifiable from other edge potential positions. After step 211 is completed, the processing ends.

(Parameter Adjustment by an Operator)

As is described above, the application operable on PC130 makes it possible to use the waveform data obtained in actual, perform the simulation of a mark recognition operation at any mark potential position having the position designated by an operator in the waveform data as a datum, and display the mark recognition result. In the simulation, mark recognition operation can also be performed under parameters used in actual alignment, and further, mark recognition operation can also be performed under parameters whose setting values are updated in the parameter setting window, which allows the operator to perform adjustment of the mark recognition parameters using a simulation function of the application.

First, the operator clicks the 'Load SIG FILE' button and reads in the setting values of parameters processed in exposure apparatus 100 as they are. The operator visually observes waveform data without changing the setting values of the parameters, and designates a position where a mark seems to exist from the shape of the waveform data. Then the application performs a mark recognition operation at an edge potential position specified from the designated position (a position closest to the designated position or a position having the maximum edge intensity within a predetermined range). By this operation, the mark recognition operation result at the position near from the designated position can be obtained.

For example, supposing that the mark recognition operation result is a mark recognition failure and the error factor judged in the mark recognition operation is a mark detection error that the mark width difference exceeds a limit, as is shown in FIG. 8. In this case, it can be considered that the mark could not be recognized correctly due to the mark width difference exceeding the limit. By viewing the display result of the error factor, the operator can adjust the parameters, for example, by increasing mark width limit (ALW-2) of the processing parameters in the parameter setting window.

When the operator changes the setting values such as the mark width limit (ALW-2) in the parameter setting window and pushes the 'Simulate' button, the mark recognition operation at the edge potential position is reexecuted under the changed mark width limit. In the case the setting values are appropriate and the value of the computed score is better than a threshold value, the mark detection error is solved and the possibility of succeeding in the mark recognition increases.

The operator can repeatedly perform the change in the setting of parameters and the simulation of the mark recognition operation described above, and solve mark detection errors as much as possible at the position where the mark seems to exist.

The operator can set the final setting values of parameters to exposure apparatus 100, via the parameter setting window. When the setting values of the parameters are appropriate, generation of unnecessary mark detection errors can be reduced in search alignment and wafer alignment to subsequent wafers W in exposure apparatus 100, which makes it possible to perform an appropriate mark recognition operation.

As is described in detail so far, according to the first embodiment, the system is equipped with an application which, in the case a plurality of edge potential positions that become potentials for positions of marks within an area on wafer W including marks (wafer marks $MX_p$, $MY_p$ or search marks SYM, SθM) subject to detection are extracted, obtains the recognition result of the mark using the waveform data detected by alignment system AS in the case the mark is assumed to be located at any edge potential position out of the plurality of edge potential positions, and displays the recognition result. In the application, by designating a mark approximate position by operating mouse 130M or keyboard 130K, an edge potential position of the mark can be specified based on the designated position in a predetermined method (method 1 or method 2), and the result of detection of the mark using the waveform data, in the case the mark is assumed to be located at the specified edge potential position, can be displayed. In this manner, by the designation by the operator, the operator can grasp the recognition result by referring to the display of the recognition result of the mark at any potential position.

Further, according to the first embodiment, the operator can change processing parameters necessary for the mark recognition operation via the parameter setting window. The application can obtain and display the mark recognition operation result at any designated mark potential position under the changed parameters. In this manner, the operator can adjust the processing parameters while referring to the mark recognition results at the position where the mark seems to exist.

Further, in the application of the first embodiment, using a designated position that has been input referring to the waveform display window of the application as a datum, either one of an edge potential position closest to the designated position or an edge potential position where the edge intensity is maximum within a predetermined range is selected. The operator can freely judge whether to select the edge potential position closest to the designated position or to select the edge potential position in the predetermined range including the designated position as its center. In this manner, even if the operator roughly designates a position where the mark is to be recognized by operating the mouse referring to the waveform display, a secure mark recognition operation can be executed in the vicinity of the position.

Although in the first embodiment, the operator designates a position for performing the mark recognition, however, normally, there are many cases where as the position that the operator designates, the position closest to a design mark position is designated. However, because a mark position in actual is generally deviated from the design mark position depending on the position and orientation of a wafer when being loaded on wafer stage WST, a different position from the position in design is preferably designated for a more accurate designation. Thus, the application may have a support function for the operator when the operator determines the designated position. In the following description, the support function will be described.

Figure 11A:
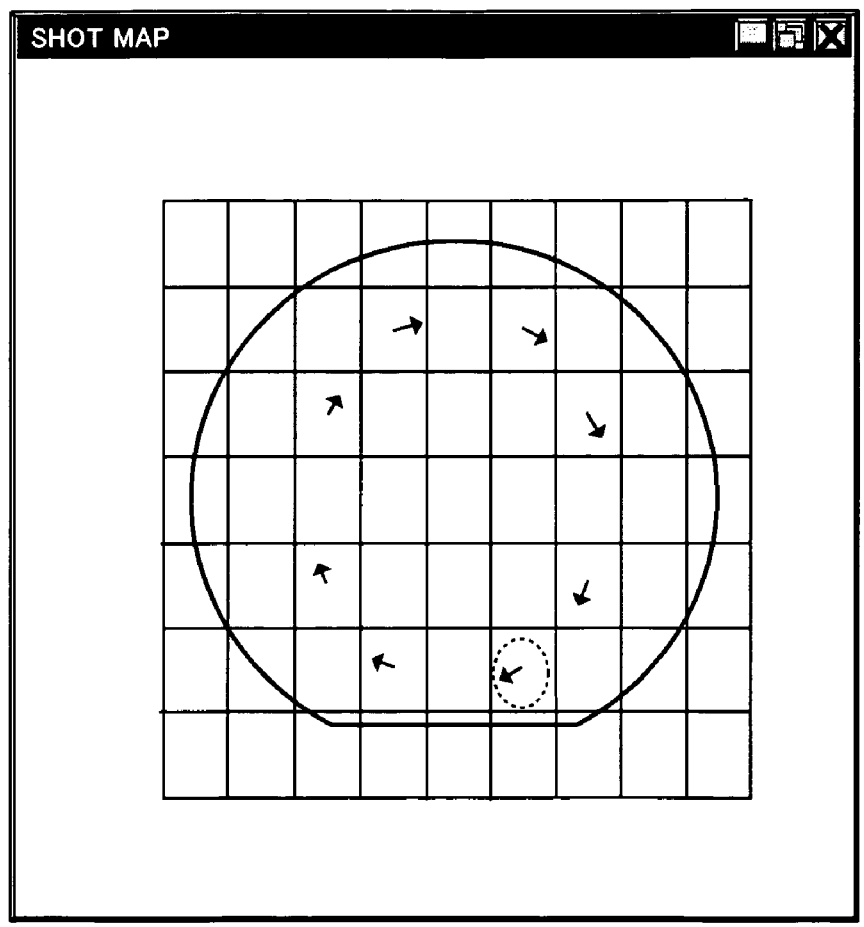
FIG. 11A is a view showing an example of an image display of alignment correction amounts.

In the support function, an image view of a shot map is displayed as shown in FIG. 11A before the operator designates a position. In a cell corresponding to each sample shot area within the shot map, an alignment correction amount of each sample shot area when performing wafer alignment on the wafer is displayed. The alignment correction amounts have been read out from the alignment history data stored in storage unit 21.

In this case, in FIG. 11A, the sample shot area surrounded by a dotted-line circle is to be a shot area where mark detection of wafer marks $MX_p$ and $MY_p$ has failed. Then, in the same manner as in the first embodiment, in the case when trying to perform analysis and evaluation of a mark search operation of the wafer marks in this sample shot area using the application of PC 130, the operator can designate a mark approximate position to perform a mark recognition operation referring to a vector representation of the alignment correction amount of this shot area.

Figure 11B:
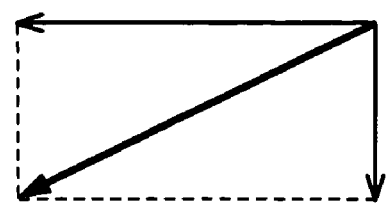
FIG. 11B is a view showing a decomposed example of a vector of an alignment correction amount.

In FIG. 11B, a vector of an alignment correction amount of a sample shot area is shown enlarged. In this case, when performing mark recognition related to wafer marks $MX_p$ and $MY_p$, an X component and a Y component of the vector of the alignment correction amount may be added to the design positions of wafer marks $MX_p$ and $MY_p$, respectively, and the positions obtained by the addition may be designated positions.

As is described, since it is considered that the sample shot areas on wafer W deviates from the design positions by the alignment correction amounts, it can be said that the mark position is preferably designated taking the alignment correction amounts into consideration.

Furthermore, as is shown in FIG. 3, the actual position coordinates of the marks on the actual wafer W slightly deviates from the position coordinates corrected by alignment correction amounts, and residual differences remain. Therefore, the mark position may be designated, further taking into consideration an X-component and a Y-component of the residual differences in addition to the X-component and the Y-component of the alignment correction amounts.

Figure 12A:
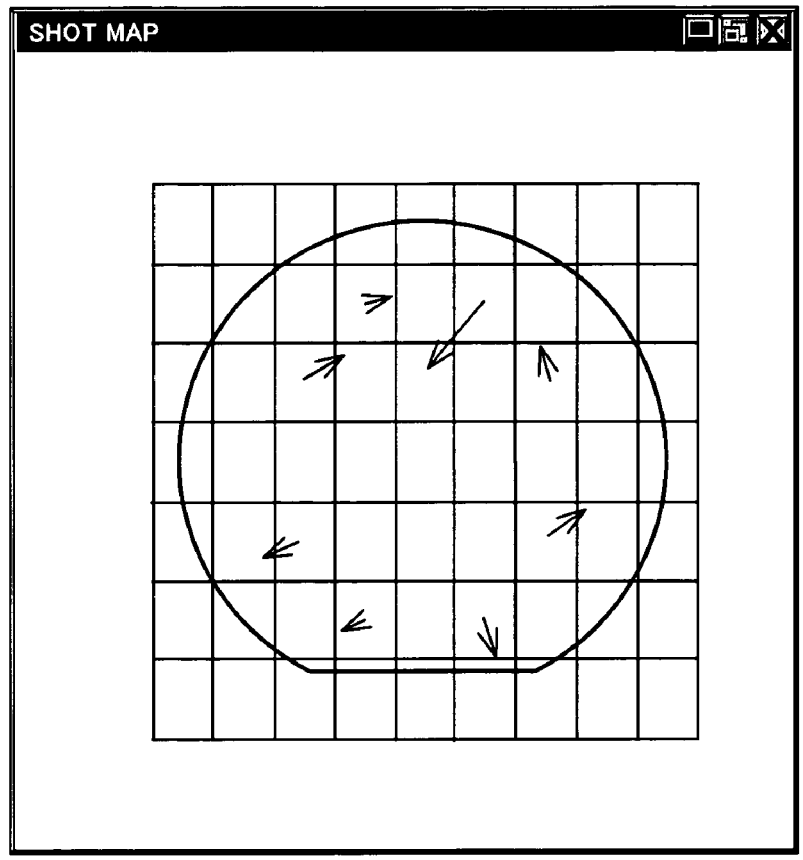
FIG. 12A is a view showing an example (No. 1) of an image display of residual differences of alignment.
Figure 12B:
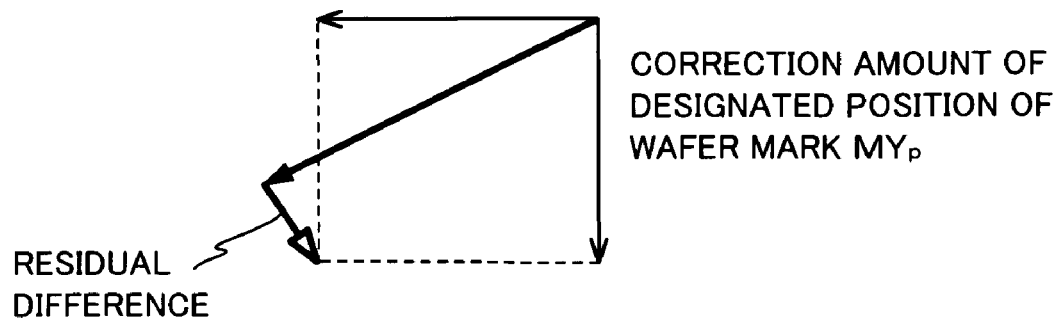
FIG. 12B is a view showing a decomposed example of a vector of a residual difference of alignment.

In FIG. 12A, residual difference in alignment in each sample shot area on any one of wafers W within the same lot is represented by a vector. Because the residual difference is so small, the residual difference in each shot area is enlarged. In the same sample shot areas on wafers W within the same lot, in the case the residual difference components are regarded as being almost the same, it is more preferable that the operator also refers to the display of the residual differences, and designates the mark position by correcting the design positions of wafer marks $MX_p$ and $MY_p$ by an X-component and a Y-component that are obtained by adding the X-component and the Y-component of the vectors of the residual differences to the X-component and the Y-component of the alignment correction amounts, as is shown in FIG. 12B.

Figure 13A:
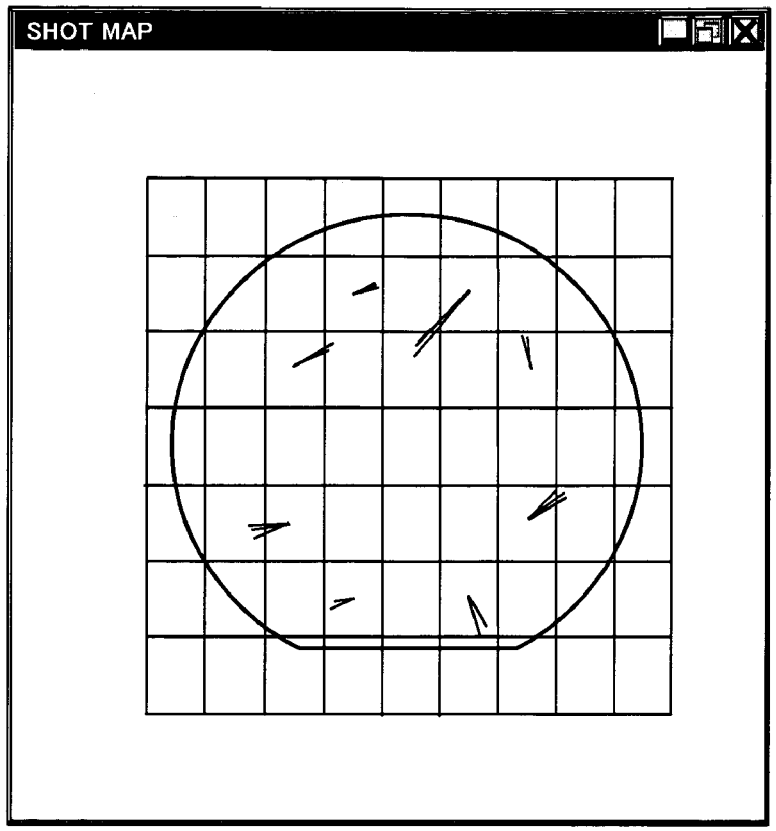
FIG. 13A is a view showing an example (No. 2) of an image display of residual differences of alignment.
Figure 13B:
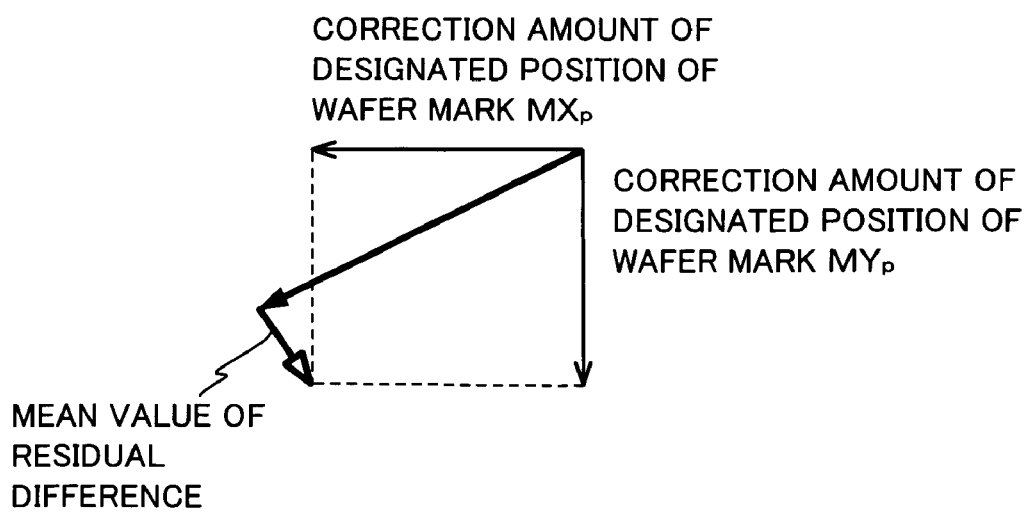
FIG. 13B is a view showing a decomposed example of a vector of a residual difference of alignment.

Incidentally, in FIG. 12A, the residual difference components on one wafer W in the same lot are displayed, however, as is shown in FIGS. 13A and 13B, the residual difference components of the rest of wafers within the lot may also be displayed and a mean value of the residual difference components in the sample shot areas may be computed. As is described above, in the case there is not much deviation in the residual difference components in the same sample shot areas on wafers W in the lot, by using a mean value of the residual difference components on the rest of wafers W in the lot to correct a mark position to be designated, the reliability of the designated position will further improve.

Incidentally, in the case the deviation in the residual differences in the same sample shot areas on the wafers in the lot exceeds the limit, such correction of the designated position using residual differences (or a mean value of the residual differences) should not be performed. The correction of the designated position by the residual differences is effective only in the case the deviation in the residual differences is small in the lot. In the case the residual differences of some wafers deviates greatly from those on other wafers within the lot, the residual differences obtained from such wafers may be excluded when calculating a mean value.

Incidentally, in the wafer alignment, in the case the reliability of the alignment results is not necessarily high, such as when the detection of a plurality of wafer marks fails, the designated position may be corrected according to a coordinate system based on the detection results of search marks SYM and SθM of the wafer.

Incidentally, in the first embodiment, the content finally displayed on the screen was a recognition result of the mark at one edge potential position that was ultimately specified. However, it is a matter of course that the simulation of the mark recognition operation may be performed at a plurality of edge potential positions and the results may be displayed.

Figure 14:
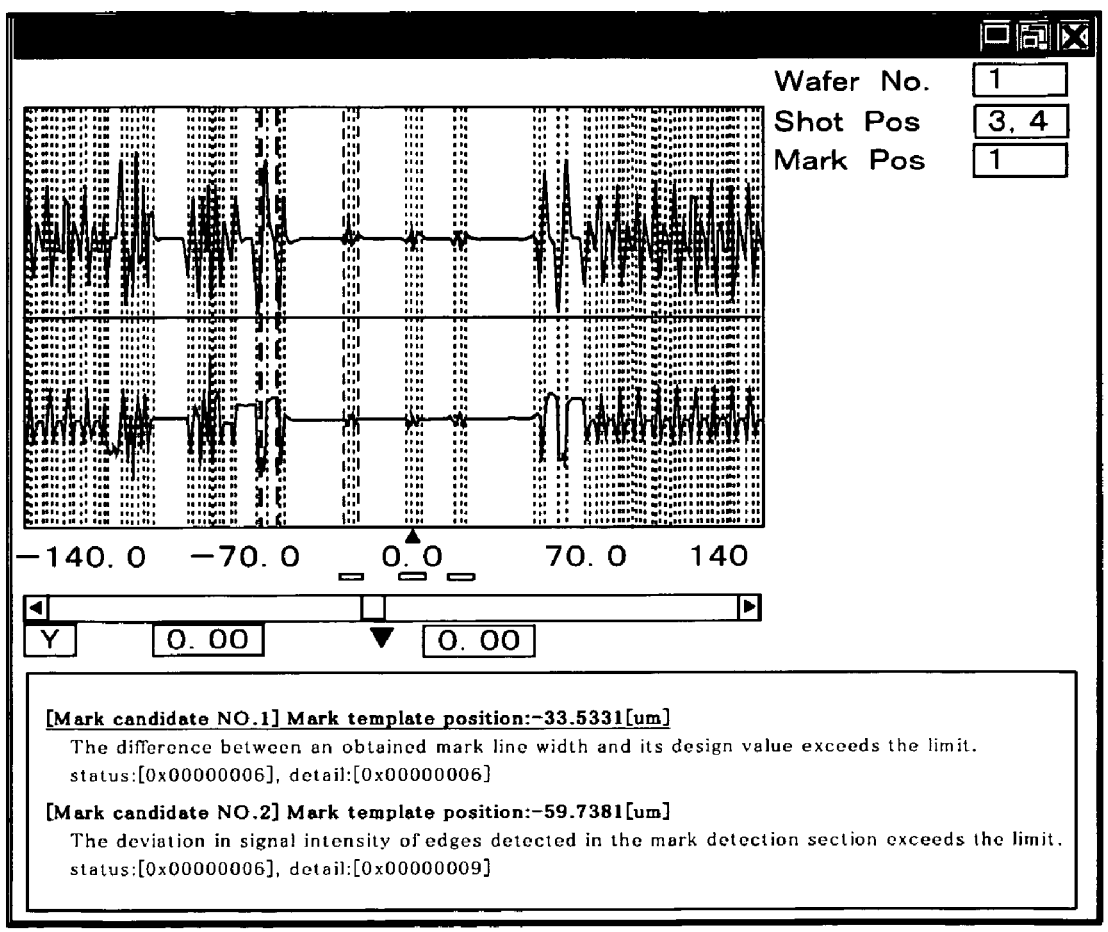
FIG. 14 is a view showing another example of a waveform display window.

For example, in the above step 209, among edge potential positions within a predetermined range having a designated position as a datum, the mark recognition operation is performed to each of a plurality of edge potential positions in the proximal order to the designated position or the order of intensity of the edge, and in the above step 211 the recognition results of the respective edge potential positions are displayed together. In FIG. 14, an example of the displayed recognition results is shown. Incidentally, in FIG. 14 the recognition results (such as error display) of the marks are not displayed in a popup window, and error factors at a plurality of edge potential positions are displayed on the lower side of the waveform display window. The displaying order in this case may also be in the proximal order to the designated position or the order of intensity of the edge.

In the example shown in FIG. 14, the mark width difference exceeding the limit causes the mark detection error corresponding to the edge potential position of top priority, and the deviation in the edge intensity of line patterns exceeding the limit causes the mark detection error corresponding to the edge potential position of second priority. In the case the deviation in the edge intensity exceeds the limit, the edge potential position is unlikely a mark position, and therefore the edge potential position is not a mark position to be detected. Then, in this case, the operator changes the mark width limit (ALW-2) and the like in the parameter setting window to solve the error factor at the edge potential position.

In this manner, when the mark recognition results at a plurality of edge potential positions can be displayed, the range of the specified edge potential positions can be wider. As a consequence, it becomes possible to more securely obtain the mark recognition results at the mark positions to be detected originally, as well as to more securely perform error recovery such as adjustment of the parameters.

Second Embodiment

Next, a second embodiment of the present invention will be described. In the first embodiment, the case has been described where the mark search operation in search alignment or wafer alignment is evaluated in PC130 connected to exposure apparatus 100. In the second embodiment, however, the case will be described where automatic adjustment of processing parameters of the mark recognition operation is performed when performing search alignment or wafer alignment in exposure apparatus 100.

The configuration of an exposure apparatus related to the second embodiment is same as the configuration of exposure apparatus 100 in the first embodiment, and therefore, the detailed description will be omitted. In addition, a series of exposure operations is almost same as the operations in the first embodiment except for a wafer alignment operation. In the wafer alignment operation, only the point where an automatic adjustment operation of parameters is performed as a final operation in the wafer alignment in the case a mark detection error occurs in any sample shot area after the EGA model equation is determined and the EGA correction amount of each shot area is computed is different. Accordingly, in the following description, only the automatic adjustment operation of the parameters will be described.

Figure 15:
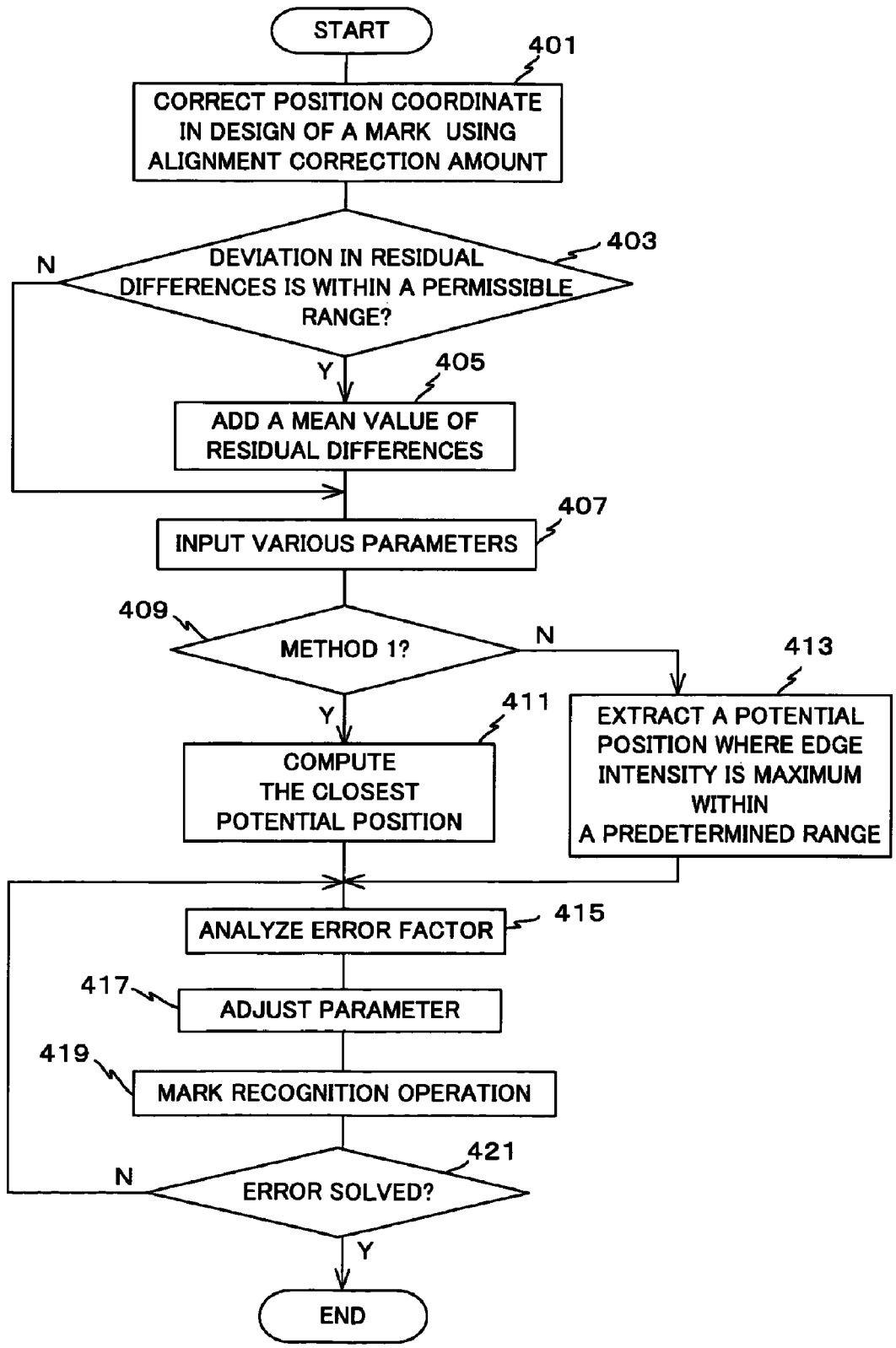
FIG. 15 is a flowchart showing a simulation processing of a mark recognition operation in a second embodiment of the present invention.

FIG. 15 shows a flowchart showing the parameter automatic adjustment operation. As is shown in FIG. 15, first, in step 401, a design position coordinate of a wafer mark in sample shot area $SA_p$ where a mark detection error occurs is corrected using an alignment correction amount that is obtained by the EGA model equation. The correction method in this case is also same as the method described in the first embodiment.

In the next step, step 403, the judgment is made of whether or not the deviation in residual differences on wafers W in the lot falls within a permissible range. When the judgment is affirmed, the procedure proceeds to step 405, and when the judgment is denied, the procedure proceeds to step 407.

In step 405, in wafer W in the lot, a mean value of an X-component and a Y-component of the residual difference of the alignment correction amount in sample shot area $SA_p$ is computed, and the mean value is added to an X-component and a Y-component of the alignment correction amount. The correction method in this case is also same as the method described in the first embodiment.

A processing in steps 407 to 413 is almost same as the processing in steps 201 to 211 in FIG. 9 in the first embodiment. That is, in step 409, setting values of parameters of the mark recognition operation are read in, and in the case method 1 is selected, the procedure proceeds to step 411, in which an edge potential position is computed closest to a position where the alignment correction amount and further the residual difference component are added to the design position coordinate of the wafer mark. In the case method 2 is selected, the procedure proceeds to step 413, in which an edge potential position of the maximum edge intensity is computed among edge potential positions within a predetermined range having the position where the alignment correction amount and further the residual difference component are added to the design position coordinate of the wafer mark, as a datum. The computation method is also same as the first embodiment.

In step 415, an error factor at the determined edge potential position that is stored in storage unit 21 is obtained, and in step 417 parameters related to the error factor are adjusted. In other words, also in the second embodiment, similar to the first embodiment, parameters to be adjusted are selected based on an error factor of the mark detection error. For example, in the case an error related to a mark width occurs, a parameter directly related to the mark width is adjusted, and in the case an error related to a distance between marks occurs, a parameter directly related to the distance between marks is adjusted. In the next step, step 419, a mark recognition operation at the selected edge potential position is performed and in step 421 the judgment is made of whether or not the mark detection error is solved. In the case the mark detection error is not solved, the procedure returns to step 415. In step 415, the error factor is analyzed again and in step 417, a parameter related to the analyzed error factor is adjusted, and then in step 419 the mark recognition operation is performed again.

In the case the mark detection error of an error factor is not solved in this manner, as long as another error factor that is different from the error factor newly occurs, the processing of steps 415→417→419→421 is repeated. By this operation, when the mark detection error is ultimately solved, the judgment in step 421 is affirmed and the processing ends.

Incidentally, in the case the number of wafer marks where mark recognition has failed is more than one, the above processing is performed with respect to each wafer mark. In this case, when the number of wafer marks that allows the EGA model equation to be computed with good accuracy is detected, the processing may be completed at this point. Further, in the case the recognition result of a wafer mark is not improved, the parameter automatic adjustment of the wafer mark may be suspended and the parameter automatic adjustment of the next wafer mark may be started. Also, as in the first embodiment, manual adjustment of the parameters may be performed by operations of the operator.

After the processing, when wafer alignment is performed to wafer W loaded to exposure apparatus 100, the mark recognition operation is performed under such adjusted parameters.

Further, in the case the recognition result of the mark recognition operation is favorable after the adjustment of the parameters and detection of the mark are successful, wafer alignment may be performed again using position information of the mark, or the remeasurement of the wafer mark by alignment system AS may be performed.

As is described in detail so far, also in the second embodiment, an edge potential position where the mark recognition operation is performed is specified from among a plurality of edge potential positions that become potentials for a position of a mark. However, the edge potential position is not specified based on instructions from an operator as in the first embodiment, and a position and a range that serve as a datum to specify the edge potential position are estimated by correcting the position coordinates in design of wafer marks $MX_p$ and MYP, based on the alignment correction amount of the shot areas on wafer W which correction amount has been already obtained by the EGA model equation and the residual differences of the sample shot areas $SA_p$ on other wafers W within the lot. This operation makes it possible to perform evaluation of the mark recognition operation focusing on the positions where there is a statistically high possibility that the wafer marks exist, and to perform adjustment of the parameters automatically.

Incidentally, in the second embodiment, a mean value of the residual differences in the sample shot areas on the rest of wafers within the lot is added to the alignment correction amount. However, as in the first embodiment, the residual difference on any one of wafers within the lot may simply be added to the alignment correction amount. In this case, when the deviation in the residual differences is large within the lot, it is preferable that the residual difference is not added to the alignment correction amount.

Incidentally, in the above first and second embodiments, the adjustment of the setting values performed is limited to the processing parameters directly related to the error factors, however, in actual, there may be cases where a relation between error factors and processing parameters are complicated. Therefore, after the parameter adjustment described in each embodiment is performed, the adjustment results may be stored and used in the subsequent parameter adjustment. For example, in the case the same error factor occurred in the past, the parameter adjusted at that time and its setting value become a guide for parameter adjustment. Also, in the case a plurality of processing parameters has to be adjusted, the succeeding parameter adjustment may be performed according to the priority order of the parameter adjustment that was effective. In other words, by having a learning function for performing the parameter adjustment by empirical rule based on the past adjustment results, it also becomes possible to increase the adjustment efficiency.

Incidentally, in each of the above embodiments, the recognition operation of wafer marks has been mainly described. However, the present invention is not limited to this, and the present invention can be used for a recognition operation of search marks as is described earlier.

However, in the actual process (lot operation), since there is not enough information that can be utilized to estimate the positions of search marks using the detection results of search marks such as a correction amount corresponding to the alignment correction amount and a residual difference, another method needs to be applied as the estimation method of the search mark positions. In the following description, such a method will be described.

First, in the evaluation of a mark recognition operation of a search mark (SYM in this case) that is measured first, the XY position and rotation of wafer W are to be aligned with relatively good accuracy in the alignment of wafer W that is performed before loading wafer W, and the design position coordinate is to be a designated position. And, in the evaluation of a mark recognition operation of a search mark (SθM in this case) that is measured secondly, a position coordinate of search mark SθM, which is projected from the detected X-position and Y-position of search mark SYM obtained in the evaluation of the mark recognition operation of search mark SYM, is to be a designated position.

Except for the estimation of the designated position as is described above, also with respect to search marks, the parameter adjustment and the like can be achieved in the same method as the evaluation of the mark recognition operation of wafer marks in each of the above embodiments.

Incidentally, information utilized to specify an edge potential position is not limited to alignment correction amounts in sample shot areas on the wafer and the residual differences in wafer alignment performed to other wafers in the lot, and the information may be empirical information already obtained or design information of wafer marks. For example, information related to an arrangement error of shot areas (a so-called error between shots) formed on the wafer that have been measured beforehand on the wafer, or information related to deviation of a stage coordinate system of exposure apparatus 100 measured in advance from a stage coordinate system of other exposure apparatus used in the original process may be used for the selection of edge potential positions.

In addition, in each of the above embodiments, in the case the residual differences in the sample shot areas on other wafers in the lot exceed a predetermined threshold value, the residual differences do not have to be used for the computation of a mean value.

In addition, in each of the above embodiments, the mark detection waveform is differentiated, and position information of the mark is detected by calculation of a characteristic amount of the mark from the differential results, however, the position information can be detected by other methods. For example, an operation may be performed in which a correlation processing between the detected waveform data of the mark and template waveform data is performed, and a position where the correlation value is highest is to be a mark position. In this case, a correlation value at each position, which is obtained when a template pattern obtained in the correlation processing is scanned with respect to the detected waveform data, can be the score.

Figure 16:
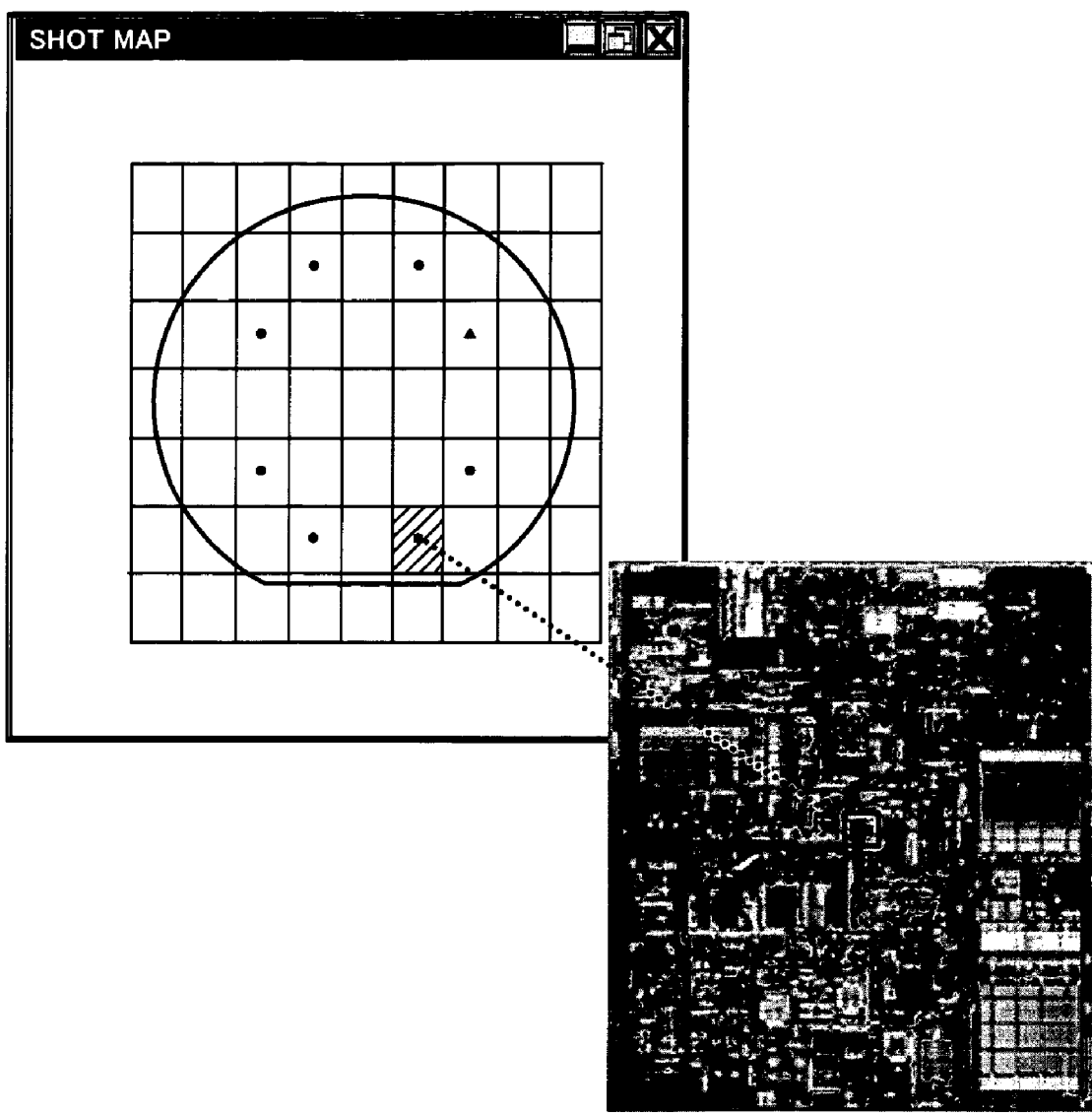
FIG. 16 is a view used to explain a mark search operation in two-dimensional image data.

In each of the above embodiments, the mark search operation in the one-dimensional waveform has been described. However, the present invention is not limited to this, and the present invention can be applied to the case when marks are searched within two-dimensional image data. FIG. 16 shows a model of a shot map display and a two-dimensional cross mark formed in a circuit pattern on a shot area in the shot map.

Also in this case, it is possible to implement a differential processing to a two-dimensional image signal data to extract a plurality of edge potential positions, to position a starting point of mark template waveform with the edge potential positions, to digitalize the degree of correlation at each position to a score, and to detect position information of the mark based on the score as in each of the above embodiments. However, in the case the mark cannot be appropriately recognized due to the influence of the neighboring circuit patterns, evaluation of the mark recognition operation is to be performed in the same manner as in each of the above described embodiments. The position designated in this case may be based on a design position coordinate of the mark within the shot area, a measurement value of the position of the mark measured previously or the like.

In the above-described waveform processing including an example of this two-dimensional image, the case has been described where the present invention is applied to the method in which the position of the mark is detected based on the edge potential position extracted by implementing a differential processing to the detected raw waveform data, however, the present invention is not limited to this. For, example, in the case of the two-dimensional image processing described above as an example, the present invention can be applied to evaluation of an image processing in which a template pattern of the mark is scanned in two-dimensional directions to raw image data, and a position where the correlativity is highest is detected as a mark position, that is, an image processing in which the position of the mark is detected utilizing the grayscale of the image. The present invention is not limited to image processing methods such as contour correlation and normalized correlation methods.

Also in this case, when the mark is searched, using a design position coordinate of the mark or a position based on the actual measurement position of the mark measured previously as a datum, the parameters of the image processing can appropriately be adjusted.

Incidentally, in each of the above embodiments, the processing parameters of the operation are adjusted based on the evaluation results of the mark search, however, the present invention is not limited to this. For example, the marks that the mark detection errors are not solved ultimately may be excluded from the measurement subjects in alignment in the operation of the succeeding wafers. In other words, the marks subject to detection may be selected based on the evaluation results of the mark search. Further, the processing procedures may be optimized, by changing the order of the processing procedures in the above mark recognition algorithm, or the like.

For analyzing the cause of a mark recognition error generation, data other than the waveform data detected by alignment system AS can be used. For example, a focus deviation, an exposure amount, wafer flatness, a synchronous accuracy error between a wafer stage and a reticle stage and the like when the mark was transferred and formed are logged in the exposure apparatus where the mark was transferred and formed, and therefore, the processing parameters may be adjusted referring to these results.

Further, in each of the above embodiments, the mark subject to detection is an L/S mark, however, the present invention is not limited to this. The mark may be a one-line mark, a box mark or a set of these marks. The mark subject to detection may be two-dimensional or one-dimensional as long as the mark is unique, and a mark of any shape and any size may be used.

Incidentally, in each of the above embodiments, the case has been described where alignment system AS has an FIA system sensor by an off-axis method (an alignment sensor by an image-forming method) and an LSA system sensor, however, the present invention is not limited to this, and alignment system AS may be an alignment system having either one of these sensors. In addition, alignment system AS may be based on either of a TTR (Through The Reticle) method, a TTL (Through The Lens) method, or an off-axis method. Further, the detection method may be a method such as in which a diffracted light or a scattered light is detected, besides an image-forming method (an image processing method) that is employed in an FIA system and the like. For example, an alignment system may be used that irradiates a coherent beam almost vertically to an alignment mark on a wafer, and detects diffracted lights of the same order (±first order, ±second order, . . . ±$n^{th}$ order) generated from the mark by making them interfere with each other. In this case, a diffracted light of each order may be independently detected and the detection result of at least one order used, or a plurality of coherent beams having different wavelengths may be irradiated to an alignment mark, and with respect to each wavelength, diffracted lights of respective orders may be detected by making them interfere with each other.

In addition, in each of the above embodiments, the case has been described where a mark for alignment is detected on a wafer, however, it is needless to say that the present invention can also be applied to a detection waveform of a mark for alignment formed on a reticle, that is, a reticle alignment mark.

In addition, the present invention can be applied not only to an exposure apparatus by a step-and-scan method as in each of the above embodiments, but can also be fully applied in the same manner to exposure apparatuses by various methods such as an exposure apparatus by a step-and-repeat method, or an exposure apparatus by a proximity method (such as an X-ray exposure apparatus).

In each of the above embodiments, as a light source, a far ultraviolet light source such as the KrF excimer laser and the ArF excimer laser, a vacuum ultraviolet light source such as the $F_2$ laser, an ultra high-pressure mercury lamp that generates bright lines in the ultraviolet region (such as the g-line or the i-line) or the like can be used. Besides the light sources above, in the case a light in the vacuum ultraviolet region is used as an illumination light for exposure, the light is not limited to the laser beams emitted from each of the light sources referred to above, and a harmonic wave may also be used that is obtained by amplifying a single-wavelength laser beam in the infrared or visible range emitted by a DFB semiconductor laser or fiber laser, with a fiber amplifier doped with, for example, erbium (Er) (or both erbium and ytterbium (Yb)), and by converting the wavelength into ultraviolet light using a nonlinear optical crystal.

Furthermore, the present invention may be applied to an exposure apparatus that uses an EUV light, an X-ray, or a charged particle beam such as an electron beam or an ion beam, as an illumination light for exposure. Besides the apparatus above, the present invention may also be applied to an immersion exposure apparatus that has a liquid filled in the space between projection optical system PL and wafer W whose details are disclosed in, for example, the pamphlet of International Publication No. WO99/49504 and the like. Also, the exposure apparatus may be a twin-wafer-stage-type exposure apparatus in which a wafer stage is arranged at an exposure position where a reticle pattern is transferred via a projection optical system and at a measurement position (an alignment position) where a mark detection is performed by a wafer alignment system, respectively, and an exposure operation and a measurement operation can be executed almost in parallel, as is disclosed in, for example, Kokai (Japanese Unexamined Patent Application Publication) No. 10-214783, the pamphlet of International Publication No. WO98/40791 and the like. Further, projection optical system PL may be either of a dioptric system, a catadioptric system or a catoptric system, and may be either of a reduction system, an equal magnification system or a magnifying system. The above disclosures of the publication and the pamphlets of International Publication are incorporated herein by reference.

Incidentally, in the above embodiments, a light transmittance mask is used that is a substrate of the light transmitting type where a predetermined light-shielding pattern (or a phase pattern or an extinction pattern) is formed, or a light reflection mask is used that is a substrate of the light reflecting type where a predetermined light-reflecting pattern is formed. However, instead of these masks, an electron mask may be used that forms a transmittance pattern, a reflection pattern, or an emission pattern, based on the electron data of the pattern to be exposed. Such an electron mask is disclosed in, for example, the U.S. Pat. No. 6,778,257. The disclosure of the U.S. Pat. No. 6,778,257 is incorporated herein by reference.

Incidentally, the electron mask referred to above is a concept including both a non-emissive image display device and a self-emissive image display device. In this case, the non-emissive image display device is also called as a spatial light modulator, which is a device that spatially modulates an oscillation width, state of phase or polarization of light, and is categorized into a transmissive spatial light modulator and a reflective spatial light modulator. In the transmissive spatial light modulator, a transmissive liquid crystal display (LCD) device, an electrochromic display (ECD), and the like are included. In the reflective spatial light modulator, a DMD (Digital Mirror Device, or Digital Micro-mirror Device), a reflection mirror array, a reflective liquid crystal display device, an electrophoretic display (EPD), an electron paper (or an electron ink), a grating light valve, and the like are included.

In addition, in the self-emissive image display device, a CRT (Cathode Ray Tube), an inorganic EL (ElectroLuminescence) display, a field emission display (FED), a plasma display panel (PDP), and a solid light source chip having a plurality of luminous points, a solid light source chip array where a plurality of chips are arranged in an array shape, a solid light source array that is a substrate where a plurality of luminous points are made (such as an LED (Light Emitting Diode) display, an OLED (Organic Light Emitting Diode) display, an LD (Laser Diode) display), and the like are included. Incidentally, by removing fluorescent materials set at each pixel of the known plasma display (PDP), it becomes a self-emissive image display device that emits light in the ultraviolet region.

Incidentally, the usage of the present invention is not limited to the exposure apparatus for manufacturing semiconductors, and the present invention can also be applied to exposure apparatuses such as an exposure apparatus used for manufacturing displays including liquid crystal display devices that transfers a device pattern onto a glass plate, an exposure apparatus used for manufacturing thin-film magnetic heads that transfers a device pattern onto a ceramic wafer, and an exposure apparatus used for manufacturing imaging devices (such as CCD), micromachines, organic EL, DNA chips or the like. In addition, the present invention can be applied to an exposure apparatus that transfers a circuit pattern onto a glass substrate or a silicon wafer, not only when producing microdevices such as semiconductor devices, but also when producing a reticle or a mask used in exposure apparatuses such as an optical exposure apparatus, an EUV exposure apparatus, an X-ray exposure apparatus, or an electron beam exposure apparatus. In this case, in the exposure apparatus that uses DUV (deep (far) ultraviolet) light, VUV (vacuum ultraviolet) light or the like, normally a transmittance type reticle is used, and as the reticle substrate, materials such as silica glass, fluorine-doped silica glass, fluorite, magnesium fluoride, or crystal are used. Further, in an X-ray exposure apparatus based on the proximity method, or in an electron beam exposure apparatus, a transmittance type mask (a stencil mask, a membrane mask) is used, and as the mask substrate, silicon wafer or the like is used.

In addition, in each of the above embodiments, the case has been described where the present invention is applied to an exposure apparatus and the analysis and evaluation thereof, however, besides an exposure apparatus, the present invention can be applied to any apparatus that performs a waveform processing or an image processing when the analysis and evaluation of the processing is performed, such as an inspection apparatus, a carriage apparatus, a measuring apparatus, a test apparatus, and other apparatuses. In this case, the present invention can also be applied by incorporating the application function described above not into an information processor such as a personal computer but into the main body of each type of apparatuses such as an exposure apparatus.

A semiconductor device is manufactured through the following steps: a step of performing function and performance design of device, a step of manufacturing a reticle based on the design step, a step of manufacturing a wafer using materials such as silicon, a step of transferring a pattern of the reticle to the wafer by exposure apparatus 100 in the embodiment described above, a step of assembling the device (including the dicing process, the bonding process, and the packaging process), an inspection step, and the like.

In addition, in each of the above embodiments, the operating system (OS) to control PC130 is Windows (registered trademark), however, other OS may naturally be used as long as the OS is a multitask operating system that supplies a GUI. Such an OS may be preemptive or non-preemptive.

Incidentally, at present, in the OS as described above various types of programming development languages and API (Application Programming Interface) are supported, and a software of the above application can be developed without difficulty. Basically, the application's act with respect to the generated event (i.e. the operation by an operator), or to be more specific, the processing contents of a message handler or the like with respect to a message sent to the application only has to be designed.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An evaluation system that evaluates a search operation that detects a detection subject on an object by using a photoelectric conversion signal obtained by photoelectrically detecting an area to be detected that includes the detection subject, the system comprising:

an obtaining unit that obtains results of detection of the detection subject that uses the photoelectric conversion signal by assuming that the detection subject is located at any potential position among a plurality of potential positions with the area to be detected;

a specifying unit that specifies at least one potential position from among the plurality of potential positions, based on specifying information used to specify a potential position of the detection subject;

a computing unit that, based on the results of detection obtained by the obtaining unit assuming that the detection subject is located in the at least one potential position specified by the specifying unit, obtains a plurality of characteristic amounts of the detection subject at the specified potential position, and based on the plurality of characteristic amounts, computes a degree of recognition of the detection subject;

an analyzing unit that determines whether or not the detection subject can be recognized based on the degree of recognition computed by the computing unit and a threshold value set in advance, and in the case when the detection subject cannot be recognized, analyzes an error factor that affects the degree of recognition; and a display unit that displays the error factor analyzed by the analyzing unit, wherein the detection subject is one of a plurality of marks formed in the same or similar process on an object, the evaluation system further comprising:
an estimating unit that estimates the specifying information, based on processing results of a statistical processing using position information of other marks on the object that exclude a mark serving as the detection subject included in the area to be detected.

2. The evaluation system according to claim 1, further comprising:
an input unit that is used for inputting the specifying information, wherein
the specifying unit specifies the at least one potential position based on the specifying information inputted by the input unit.

3. The evaluation system according to claim 1 wherein
the estimating unit estimates the specifying information, based on one of empirical information or past history data about the search operation of the detection subject already obtained and design information of the detection subject.

4. The evaluation system according to claim 1 wherein
the detection subject is one of a plurality of marks formed in the same or similar process on each of a plurality of objects, and
the estimating unit corrects the specifying information, based on information related to a residual difference of an actual measurement position information of a mark arranged on other objects at a position the same as the detection subject, with respect to a datum obtained by a statistical processing using position information of a plurality of marks on the other objects different from an object on which the detection subject is formed, among the plurality of objects.

5. The evaluation system according to claim 4 wherein
the detection subject is one of a plurality of marks formed respectively in the same or similar process on at least two objects, and
the estimating unit computes a mean value of the residual difference corresponding to each mark arranged at the same position on a remaining object other than an object on which the detection subject is formed among the at least two objects, and corrects the specifying information based on the mean value.

6. The evaluation system according to claim 5 wherein
the estimating unit avoids using the residual difference when computing the mean value in the case that deviation in the residual difference corresponding to a mark arranged at the same position on the remaining object exceeds a predetermined threshold value.

7. The evaluation system according to claim 1 wherein
in the specifying information, one of information related to at least one specific position within the area to be detected and information related to at least one specific range within the area to be detected is designated.

8. The evaluation system according to claim 1 wherein
in the case a plurality of potential positions are specified by the specifying unit,
the obtaining unit obtains a detection result corresponding to the respective plurality of potential positions in the case the detection subject is assumed to be located at each of the plurality of potential positions, and
the analyzing unit ranks detection results corresponding to each of the plurality of potential positions in a predetermined order.

9. The evaluation system according to claim 8 wherein
the predetermined order is one of an order in accordance with a characteristic of a signal corresponding to the detection subject and a proximity order to the specific position.

10. The evaluation system according to claim 1, further comprising:
an adjusting unit that adjusts a signal obtaining unit that obtains a photoelectric conversion signal corresponding to the area to be detected including the detection subject, based on results of the recognition operation executed by the analyzing unit.

11. The evaluation system according to claim 10, further comprising:
an instructing unit that instructs the signal obtaining unit adjusted by the adjusting unit to obtain again a photoelectric conversion signal corresponding to the area to be detected including the detection subject.

12. The evaluation system according to claim 1, wherein
the detection subject is a mark arranged on an object, and
the results of the recognition operation include mark-detection-error information that is detected based on an index value, which indicates a difference between design information and actual measurement information related to each of a plurality of different characteristics of the mark.

13. The evaluation system according to claim 12 wherein
the detection subject includes a line-and-space mark arranged on an object, and
the plurality of different characteristics of the detection subject include at least one of a mark width, a mark pitch and the number of lines of the line-and-space mark.

14. The evaluation system according to claim 1, wherein
the degree of recognition includes whether the detection subject can be recognized at the specified potential position, and
the analyzing unit analyzes the error factor in the case that the detection subject cannot be recognized at the specified potential position.

15. The evaluation system according to claim 14, wherein
the detection subject is one of a plurality of marks formed on the object, and
the error factor includes at least one of a width error of the mark, a distance error of the mark, and an error of edge intensity of the mark.

16. The evaluation system according to claim 15, further comprising:
a parameter adjusting unit that adjusts a recognition parameter that is used to compute the degree of recognition of the detection subject at the specified potential position, based on display results displayed by the display unit.

17. The evaluation system according to claim 1, wherein:
the display unit displays results of the recognition operation executed by the analyzing unit.

18. An evaluation method of a search operation that detects a detection subject on an object by using a photoelectric conversion signal obtained by photoelectrically detecting an area to be detected that includes the detection subject, the method comprising:
specifying at least one potential position where results of detection of the detection subject that uses the photoelectric conversion signal are obtained, from among a plurality of potential positions within the area to be detected;
obtaining results of detection of the detection subject that uses the photoelectric conversion signal in the at least one potential position specified in the specifying;

computing a degree of recognition of the detection subject based on a plurality of characteristic amounts of the detection subject at the specified potential position that are obtained based on the results of detection obtained in the obtaining;

determining whether or not the detection subject can be recognized based on the degree of the recognition computed in the computing and a threshold value set in advance, and in the case when the detection subject cannot be recognized, analyzing an error factor that affects the degree of recognition; and displaying the error factor analyzed in the analyzing, wherein the detection subject is one of a plurality of marks formed in the same or similar process on an object, the evaluation further comprising:

estimating the specifying information, based on processing results of a statistical processing using position information of other marks on the object that exclude a mark serving as the detection subject included in the area to be detected.

19. The evaluation method according to claim 18, further comprising:

inputting specifying information used to specify a potential position of the detection subject, prior to the specifying, wherein in the specifying, the at least one potential position is specified based on the specifying information inputted in the inputting.

20. The evaluation method according to claim 18 wherein in the estimating, the specifying information is estimated, based on one of empirical information or past history data about the search operation of the detection subject already obtained and design information of the detection subject.

21. The evaluation method according to claim 18 wherein the detection subject is one of a plurality of marks formed in the same or similar process on each of a plurality of objects, and in the estimating, the specifying information is corrected, based on information related to a residual difference of an actual measurement position information of a mark arranged on other objects at a position the same as the detection subject, with respect to a datum obtained by a statistical processing using position information of a plurality of marks on the other objects different from an object on which the detection subject is formed, among the plurality of objects.

22. The evaluation method according to claim 21 wherein the detection subject is one of a plurality of marks formed respectively in the same or similar process on each of at least two objects, and in the estimating, a mean value of the residual difference corresponding to each mark arranged at the same position on a remaining object other than an object on which the detection subject is formed among the at least two objects is computed, and the specifying information is corrected based on the mean value.

23. The evaluation method according to claim 22 wherein in the estimating, in the case that deviation in the residual difference corresponding to the mark arranged at the same position on the remaining object exceeds a predetermined threshold value, usage of the residual difference is avoided in computation of the mean value.

24. The evaluation method according to claim 18 wherein in the specifying information, one of information related to at least one specific position within the area to be detected and information related to at least one specific range within the area to be detected is designated.

25. The evaluation method according to claim 18, wherein in the case there are a plurality of potential positions specified in the specifying, in the obtaining, a detection result corresponding to the respective plurality of potential positions in the case the detection subject is assumed to be located at each of the plurality of potential positions is obtained, and in the analyzing, the detection results corresponding to each of the plurality of potential positions are ranked in a predetermined order.

26. The evaluation method according to claim 25 wherein the predetermined order is one of an order in accordance with a characteristic of a signal corresponding to the detection subject and a proximity order to the specific position.

27. The evaluation method according to claim 18, further comprising:

adjusting a signal obtaining unit that obtains a photoelectric conversion signal corresponding to the area to be detected including the detection subject, based on the results of the recognition operation executed in the analyzing.

28. The evaluation method according to claim 27, further comprising:

instructing the signal obtaining unit adjusted in the adjusting to obtain again a photoelectric conversion signal corresponding to the area to be detected including the detection subject.

29. The evaluation method according to claim 18, wherein the detection subject is a mark arranged on an object, and in the analyzing, mark-detection-error information that is detected based on an index value is analyzed, the index value indicating a difference between design information and actual measurement information related to each of a plurality of different characteristics of the mark.

30. The evaluation method according to claim 29 wherein the detection subject includes a line-and-space mark arranged on an object, and the plurality of different characteristics of the detection subject include at least one of a mark width, a mark pitch and the number of lines of the line-and-space mark.

31. The evaluation method according to claim 18, wherein in the analyzing, whether the detection subject can be recognized at the specified potential position is analyzed, and in the case that the detection subject cannot be recognized as a result of the analyzing, the error factor is analyzed.

32. The evaluation method according to claim 31, wherein the detection subject is one of a plurality of marks formed on the object, and in the analyzing, at least one of whether a width error of the mark exceeds a permissible value, whether a distance error of the mark exceeds a permissible value, and whether an error of edge intensity of the mark exceeds a permissible value is analyzed.

33. The evaluation method according to claim 32, further comprising:

adjusting a recognition parameter that is used to compute the degree of recognition of the detection subject at the specified potential position, based on display results displayed in the displaying.

34. The evaluation method according to claim 18, further comprising:

displaying results of the recognition operation executed in the analyzing.

* * * * *